United States Patent
Zhao et al.

(10) Patent No.: US 11,563,453 B1
(45) Date of Patent: Jan. 24, 2023

(54) TIME CONSTANT TRACKING FOR DIGITAL PRE-DISTORTION

(71) Applicant: XILINX, INC., San Jose, CA (US)

(72) Inventors: Hongzhi Zhao, Los Gatos, CA (US); Vincent C. Barnes, El Paso, TX (US); Xiaohan Chen, Sunnyvale, CA (US); Hemang M. Parekh, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/239,395

(22) Filed: Apr. 23, 2021

(51) Int. Cl.
  *H04B 1/04* (2006.01)
  *H03F 1/32* (2006.01)

(52) U.S. Cl.
  CPC ......... *H04B 1/0475* (2013.01); *H03F 1/3247* (2013.01); *H03F 1/3258* (2013.01); *H03F 2201/3233* (2013.01); *H04B 2001/0425* (2013.01)

(58) Field of Classification Search
  CPC ......... H04B 1/0475; H04B 2001/0425; H03F 1/3247; H03F 1/3258; H03F 2201/3233
  See application file for complete search history.

(56) References Cited

U.S. PATENT DOCUMENTS

| | | | |
|---|---|---|---|
| 6,141,390 A * | 10/2000 | Cova | H03F 1/3247 332/162 |
| 7,715,810 B2 * | 5/2010 | Brobston | H03F 1/0222 455/114.2 |
| 7,737,779 B2 | 6/2010 | Summerfield et al. | |
| 7,741,906 B1 | 6/2010 | Summerfield | |
| 7,746,167 B1 | 6/2010 | Summerfield | |
| 8,229,025 B1 | 7/2012 | Summerfield | |
| 8,243,852 B1 | 8/2012 | Summerfield | |
| 8,285,770 B1 | 10/2012 | Barnes et al. | |
| 8,737,523 B2 | 5/2014 | Barnes | |
| 8,837,633 B2 | 9/2014 | Dick | |
| 9,014,241 B2 | 4/2015 | Dick | |
| 9,172,409 B2 | 10/2015 | Copeland | |
| 9,337,886 B1 | 5/2016 | Dick | |
| 9,338,039 B1 | 5/2016 | Barnes | |

(Continued)

OTHER PUBLICATIONS

U.S. Appl. No. 17/133,505, filed Dec. 23, 2020 Entitled "Thermal Effect Mitigation for Digital Pre-Distortion".

(Continued)

*Primary Examiner* — Kabir A Timory
(74) *Attorney, Agent, or Firm* — Patterson + Sheridan, LLP

(57) ABSTRACT

A transmitter for a communication system comprises a digital pre-distortion (DPD) circuit and adaptation circuitry. The DPD circuit is configured to generate a digital intermediate signal by compensating an input signal for distortions resulting from an amplifier. The amplifier is configured to output an output signal based on the digital intermediate signal. The DPD circuit includes one or more an infinite impulse response (IIR) filters configured to implement a first transfer function based on a first parameter, and a second transfer function based on the first parameter and a time constant. The DPD circuit is configured to generate an adjustment signal based on the first transfer function and the second transfer function. The adaptation circuitry is configured to update the first parameter based on the adjustment signal, the input signal, and the output signal.

20 Claims, 10 Drawing Sheets

(56) References Cited

U.S. PATENT DOCUMENTS

| | | |
|---|---|---|
| 9,455,760 B1 | 9/2016 | Dick et al. |
| 9,590,567 B2 | 3/2017 | Zhao et al. |
| 9,866,269 B1 | 1/2018 | Zhao et al. |
| 2006/0056536 A1* | 3/2006 | Hori .................. H04B 1/62 |
| | | 375/296 |

OTHER PUBLICATIONS

Benvegnu, Agostino, "Trapping and Reliability Investigations in GaN-based HEMTs", 164 pages, Sep. 28, 2016.
Jardel O. et al., "An Electrothermal Model for A1GaN/GaN Power HEMTs Including Trapping Effects to Improve Large-Signal Simulation Results on High VSWR", IEEE Transactions on Microwave Theory and Techniques, vol. 55, No. 12, Dec. 2007, pp. 2660-2669.
U.S. Appl. No. 16/903,378, filed Jun. 17, 2020 Entitled "Digital Communications Circuits and Systems".

\* cited by examiner

TIME CONSTANT TRACKING FOR DIGITAL PRE-DISTORTION

TECHNICAL FIELD

Examples of the present disclosure generally relate to digital communication circuits and systems and, in particular, to digital communication circuits implementing digital pre-distortion (DPD) processing and systems including such circuits.

BACKGROUND

Power amplifiers are generally used in communication systems to provide a gain to a signal that is being transmitted, e.g., a transmitted signal. For example, power amplifies may be used in wireless communication systems to provide a gain to a transmitted signal. Power amplifiers provide a mechanism for load matching of the medium on which a signal is to be transmitted. However, the linearity of the output of power amplifiers used in communication systems may be relatively limited, reducing performance of the communication systems. In many instances, digital pre-distortion (DPD) can be used to enhance linearity of the output response of a power amplifier. Further, adjusting various parameters within the DPD may be utilized to minimize any non-linearities within the DPD.

SUMMARY

Examples described herein provide for digital communication circuits and systems that implement digital pre-distortion (DPD). The DPD can be implemented with, among other things, one or more infinite impulse response (IIR) filters having one or more adaptable transfer functions. For example, a transfer function may include a parameter that is variable to adjust the transfer function. In some examples, by adaptively implementing one or more parameter, non-linearities caused by an amplifier having different time constants based on thermal changes and/or circuitry related delays of the amplifier can be compensated. Compensating for the non-linearities improves the linearity of a pre-distorted signal. Further, one or more circuit elements within the DPD may be shared through the implementation of time sharing, reducing the size of the corresponding hardware implementation of the DPD.

In one example, a transmitter for a communication system comprises a DPD circuit and adaptation circuitry. The DPD circuit is configured to generate a digital intermediate signal by compensating an input signal for distortions resulting from an amplifier. The amplifier is configured to output an output signal based on the digital intermediate signal. The DPD circuit includes one or more IIR filters configured to implement a first transfer function based on a first parameter, and a second transfer function based on the first parameter and a time constant. The DPD circuit is configured to generate an adjustment signal based on the first transfer function and the second transfer function. The adaptation circuitry is configured to update the first parameter based on the adjustment signal, the input signal, and the output signal.

In one example, a method of processing for transmission comprises performing digital pre-distortion on an input signal to generate a digital intermediate signal. Performing the digital pre-distortion comprises outputting a first filter response signal from one or more IIR filters. The first filter response signal is based on the input signal and a first transfer function. The first transfer function is based on a first parameter. Performing the digital pre-distortion further comprises outputting a second filter response signal from the one or more IIR filters. The second filter response signal being based on the input signal and a second transfer function. The second transfer function is based on the first parameter and a time constant. Further, performing the digital pre-distortion comprises generating an adjustment signal based on the first transfer function and the second transfer function, and updating the first parameter based on the adjustment signal, the input signal, and an output signal output by an amplifier based on the digital intermediate signal.

In one example, a communication system comprises a transmitter configured to receive an input signal to be transmitted via an antenna. The transmitter comprises a power amplification circuitry. The power amplification circuitry comprises a DPD circuit, an amplifier, and adaptation circuitry. The DPD circuit is configured to generate a digital intermediate signal based on the input signal and includes one or more IIR filters configured to implement a first transfer function based on a first parameter, and a second transfer function based on the first parameter and a time constant. The DPD circuit is further configured to generate an adjustment signal based on the first transfer function and the second transfer function. The amplifier is configured to generate an output signal based on the digital intermediate signal. The adaptation circuitry is configured to update the first parameter based on the adjustment signal, the input signal, and the output signal.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
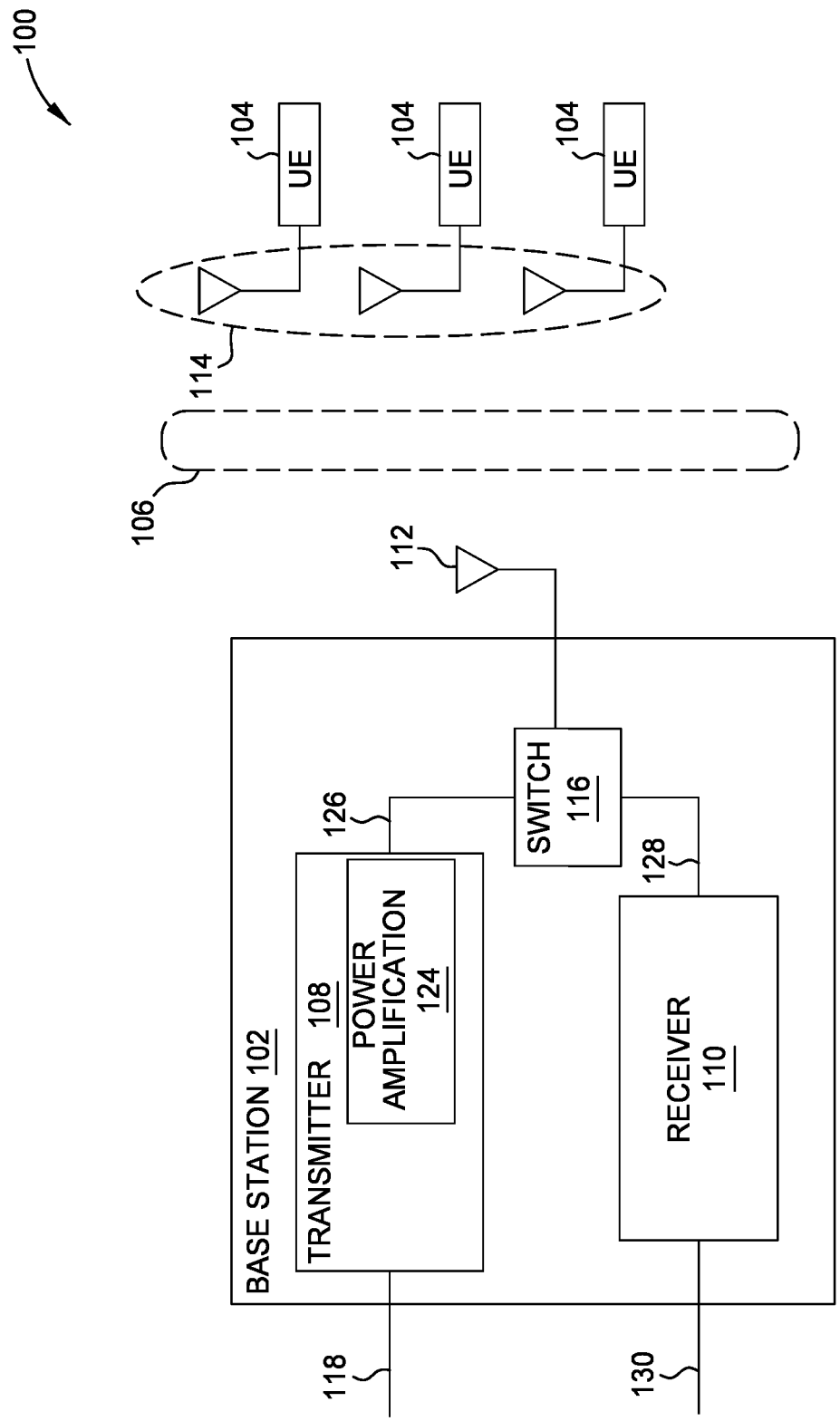
FIG. 1 is a block diagram depicting an example communication system where a power amplification circuitry including a digital pre-distortion (DPD) system may be used according to some examples.

Examples described herein provide for digital communication circuits and systems that implement digital pre-distortion (DPD). The DPD is implemented with, among other things, one or more infinite impulse response (IIR) filters that adaptively implement parameters in the respective transfer function or functions. In some examples, by adaptively implementing parameters, non-linearities caused by an amplifier having different time constants based on differing modes, thermal changes, and/or circuit related delays of the amplifier can be mitigated (e.g., compensated). Further, through the implementation of a time sharing approach within one or more IIR filters, the size of the hardware implementation of the corresponding DPD is reduced. Accordingly, non-linearities within a DPD are reduced and a signal is pre-distorted in a manner such that differences between a corresponding received signal and the original signal are reduced.

Generally, DPD processing is implemented to compensate for a non-linear response of an amplifier used in communications. Power amplifiers (PAs) are typically implemented in communication systems and are inherently non-linear. Non-linearities in PAs cause spectral growth beyond the signal bandwidth of a particular channel, which interferes with adjacent channels. Further, the non-linearities in PAs cause distortions within the signal bandwidth, causing an increased bit error rate at a receiver. In, for example, a gallium nitride (GaN) based PA, distortions can be caused by thermal effects and/or trapping effects. Trapping effects in a GaN PA vary as the temperature of the PA changes.

In some examples, a DPD system can, in compensating for effects in PAs, compensate for thermal effects of a PA based on a corresponding time constant (e.g., a thermal time constant). Some examples can implement one or more IIR filters in a DPD circuit. A parameter and a time constant are adaptively implemented in the transfer function of the IIR filter to compensate for thermal effects. For example, the parameters of the IIR filter are associated with the material characteristics of the PA device. The time constant (e.g., a time constant parameter) corresponds to a difference between different circuit elements of the DPD. For example, the time constant corresponds to differences in circuit delays and/or other circuit induced differences between the IIR filter circuits. In one example, as the material characteristics of the PA device change with the device's temperature, the parameters of the IIR filter change and introduce additional non-linearities. Accordingly, by adjusting the IIR filter transforms based on the changes in the parameters, the DPD circuit can compensate for non-linearities caused by the changing thermal effects. Additionally, or alternatively, an IIR filter circuit may perform the operations of one or more IIR filters through the use of a time constant parameter. Further, the DPD can pre-distort a signal to be transmitted to effectively extend a linear response of the amplifier.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

FIG. 1 is a block diagram depicting an example communication system 100 where a power amplification circuitry (e.g., power amplification circuitry 124) including DPD circuitry may be used. The communication system 100 includes a base station 102 and user equipment (UE) units 104. Each of the UE units 104 includes an antenna 114. The base station 102 includes a transmitter 108, a receiver 110, a switch 116, and an antenna 112. One or more UE unit 104 is communicatively coupled to the base station 102 at a time. The UE units 104 may be communicatively coupled to the base station 102 via an over-the-air (e.g., wireless) communication channel 106 using the antennas 112 and 114.

In some examples, the communication system 100 is for bidirectional communication, namely a downlink for sending information from the base station 102 to one or more UE units 104, and an uplink for sending information from one or more UE units 104 to the base station 102.

The transmitter 108 receives an input signal at an input node 118 for transmission. The transmitter 108 includes the power amplification circuitry 124 and generates a signal at output node 126. The power amplification circuitry 124 amplifies a signal to be transmitted. The signal on the output node 126 is then sent, via the switch 116, to the antenna 112 for transmission. The power amplification circuitry 124 drives the antenna 112 for transmitting the signal on the output node 126 via the wireless communication channel 106.

The receiver 110 receives a signal at an input node 128 from the antenna 112 via the switch 116. The receiver 110 performs an uplink process and outputs a signal on an output node 130.

The communication system 100 may deploy various transmission schemes, for example, frequency division duplex (FDD) and time division duplex (TDD). In some examples TDD (e.g., according to a TDD-Long-Term Evolution (LTE) standard) is deployed. In such example, the uplink is separated from downlink by the allocation of different time slots for uplink and downlink in the same frequency band. With reference to FIG. 1, in such examples, the switch 116 functions a duplexer and may be used to switch between uplink and downlink according to the allocated time slots. Time slots allocated to downlink may be referred to as transmit time slots, and time slots allocated to uplink may be referred to as receive time slots.

Figure 2:
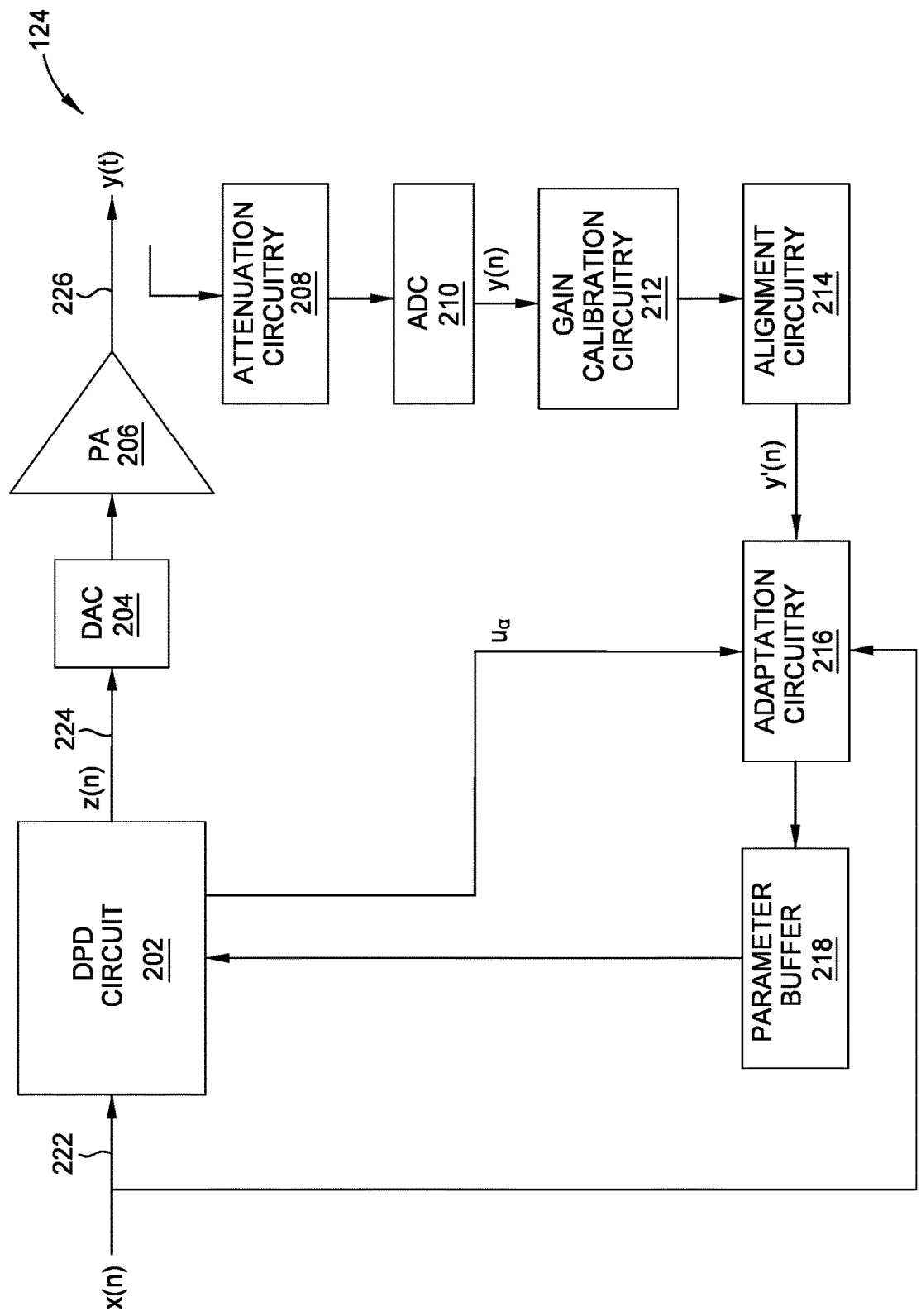
FIG. 2 illustrates an example power amplification circuitry including a DPD circuit for compensating for distortion according to some examples.

FIG. 2 illustrates an example power amplification circuitry 124 including a DPD circuitry 202 that compensates for distortion. The power amplification circuitry 124 includes the DPD circuitry 202, a digital-to-analog converter (DAC) 204, a power amplifier (PA) 206, attenuation circuitry 208, an analog-to-digital converter (ADC) 210, gain calibration circuitry 212, an alignment circuitry 214, an adaptation circuitry 216, and a parameter buffer 218. Other components may be included in the power amplification circuitry 124 that are not illustrated in FIG. 2 for clarity. For example, radio frequency (RF) mixers can be included to step-up and/or step down signals to and/or from an RF signal. Generally, the DPD circuitry 202, the DAC 204, and the PA 206 are electrically connected to receive a digital input signal x(n), process the digital input signal x(n), and generate and transmit an analog output signal y(t). Generally, the attenuation circuitry 208, the ADC 210, the gain calibration circuitry 212, the alignment circuitry 214, the adaptation circuitry 216, and the parameter buffer 218 form a feedback path to determine parameters implemented by the DPD circuitry 202.

The DPD circuitry 202 receives the digital input signal x(n) at an input node 222 of the DPD circuitry 202 and generates a digital intermediate signal z(n) on an output node of the DPD circuitry 202. The output node of the DPD circuitry 202 is an intermediate node 224 of the power amplification circuitry 124. The digital intermediate signal z(n) is a modified version of the digital input signal x(n). For example, the digital intermediate signal z(n) is a distorted version of the digital input signal x(n) that pre-distorts the digital input signal x(n) to compensate for distortions introduced by the PA 206. Further, the DPD circuitry 202 generates digital filtered signal (e.g., signal $z_{IIR}(n)$ of FIG. 5 and FIG. 7) and digital response signal (e.g., response $dr_{IIR}(n)$ of FIG. 5 and FIG. 7). Details with regard to generating the digital filtered signal and the digital response signal are provided in greater detail in the following description with regard to FIGS. 5 and 7.

The output node of the DPD circuitry 202 is coupled to an input node of the DAC 204. The DAC 204 receives the digital intermediate signal z(n) at the input node of the DAC 204, converts the digital intermediate signal z(n) to an analog signal, and outputs the analog version of the digital intermediate signal z(n) on an output node of the DAC 204. The output node of the DAC 204 is coupled to an input node of the PA 206. Further, the adaptation signal $u_\alpha$ is generated by the DPD circuitry 202 and is provided to the adaptation circuitry 216 via another output node of the DPD circuitry 202. Generation of the adjustment signal $u_\alpha$ is described in greater detail in the following with regard to FIGS. 5-8.

The PA 206 receives the analog version of the digital intermediate signal z(n) at the input node of the PA 206. In other examples, the PA 206 receives another signal based on the digital intermediate signal z(n), such as an RF signal that is the digital intermediate signal z(n) stepped up to a RF. The PA 206 applies a gain to the signal, and outputs the analog output signal y(t) on an output node of the PA 206. The output node of the PA 206 is the output node 226 of the power amplification circuitry 124.

At least a portion of the analog output signal y(t) output by the PA 206 on the output node 226 is fed back to an input node of the attenuation circuitry 208. For example, a fraction of the analog output signal y(t) (e.g., signal y'(n)) is fed back to the input node of the attenuation circuitry 208.

The attenuation circuitry 208 receives the analog output signal y(t) at an input node of the attenuation circuitry 208. The attenuation circuitry 208 attenuates the analog output signal y(t) and outputs an attenuated analog output signal to an input node of the ADC 210. The ADC 210 converts the attenuated analog output signal to a digital output signal y(n), and outputs the digital output signal y(n) on an output node of the ADC 210. The output node of the ADC 210 is electrically connected to an input node of gain calibration circuitry 212. The gain calibration circuitry 212 mitigates error within the digital output signal y(n) introduced by the ADC 210, and outputs the error mitigated digital output signal to the alignment circuitry 214 via an output node of the gain calibration circuitry 212. In one or more of the examples, one or more of the attenuation circuitry 208 and the gain calibration circuitry 212 is omitted.

The alignment circuitry 214 receives the digital output signal y(n), matches the amplitude, delay, and/or phase variations of the digital output signal y(n) to the digital signal x(n) or the digital intermediate signal z(n), and generates an aligned digital output signal y'(n). The alignment circuitry 214 includes a mixer to mix a detected phase difference in the digital output signal y(n) to generate the aligned digital output signal y'(n). The alignment circuitry 214 outputs the aligned digital output signal y'(n) on an output node of the alignment circuitry 214, which is electrically connected to an input node of the adaptation circuitry 216.

The adaptation circuitry 216 is configured to capture a predetermined number of samples of data of the aligned digital output signal y'(n). The adaptation circuitry 216 has input nodes electrically connected to the input node 222 and output node or nodes of the DPD circuitry 202. The adaptation circuitry 216 captures a predetermined number of samples of data of one or more signals provided by the DPD circuitry 202. Additionally, or alternatively, the adaptation circuitry 216 captures a predetermined number of samples of data of the digital input signal x(n). The adaptation circuitry 216 determines parameters of the DPD circuitry 202 based on the digital input signal x(n), one or more signals received from the DPD circuitry 202, and/or aligned digital output signal y'(n). In some examples, the parameters may be stored in the parameter buffer 218, and provided to the DPD circuitry 202. The parameters may be coefficients of various functions, for example, functions that modify the digital input signal x(n), such that the digital intermediate signal z(n) of the DPD circuitry 202 compensates for the distortion of the PA 206 in response to thermal changes of the power amplification circuitry 124. In one example, one or more of the parameters corresponds to a time constant of an IIR filter circuit. The time constant may be represented as Oct In one example, the time constant may be determined by modeling one or more IIR filter circuits. The modeling may be based on the characteristics of an average IIR filter circuit and/or the characteristics of the IIR filter circuits of the design of the DPD. In another example, the time constant may be determined my measuring one or more signals associated with one or more IIR filter circuits and determining the time constant based on the measured signals. In other examples, the time constant is stored within the parameter buffer 218.

In some examples, the power amplification circuitry 124 includes a mixer (e.g., an up converter) coupled between the output node of the DAC 204 and the input node of the PA 206. In some examples, an up converter receives the analog signal from the DAC 204 and converts the analog signal to an RF analog signal, which is then provided to the PA 206. The PA 206 provides an amplified RF output signal based on the input RF analog signal. In some examples, the power amplification circuitry 124 includes a mixer (e.g., a down converter) to convert the RF output signal to an intermediate frequency (IF) or baseband (BB) analog signal that is sampled to generate a digital sampled signal. The digital sampled signal is provided to the input node of the alignment circuitry 214 or adaptation circuitry 216.

In various examples, the adaptation circuitry 216 uses various numerical techniques for generating the parameters used in the DPD circuitry 202. For example, discrete characterization events where the coefficients are found that best match the PA 206 during some period of samples may be employed. For further example, a least mean squares estimation over a fixed block of samples may be used. However, in other examples, any suitable method for generating parameters for the DPD circuitry 202 may be used, and this disclosure is not meant to be limited to any specific method for generating the parameters for the DPD circuitry 202.

In various examples, the adaptation circuitry 216 provides one or more updated parameters in response to thermal changes. For example, the adaptation circuitry 216 increases the values of one or more of the parameters in response to an increase in temperature of the power amplification circuitry 124.

In various examples, the DPD circuitry 202 is implemented based on PA behavior models (also referred to as PA models) of the PA 206. After determining the PA models which model the non-linearity of the PA 206, the inverse of such PA models may be applied to the digital input signal x(n) by the DPD circuitry 202, thereby compensating for the non-linearity of the PA 206.

In some examples, the PA model is a memoryless PA model without any memory effect. Such memoryless model may include, for example, a polynomial model and Saleh's model. A DPD path implemented based on such a memoryless PA model may be referred to as a memoryless DPD path.

In some examples, the PA model is a memory PA model which considers memory effects of the PA. Memory effects of the PA may be classified as short term memory effects and long term memory effects according to time constants of the memory effects. In some examples, short term memory effects may have time constants of the order of carrier signal period (e.g., several times of the carrier signal period). In some examples, time constants of the short-term memory effects are of the order of nanoseconds. Long term memory effects may have a lower frequency (e.g., in a range between a few kilohertz (kHz) to megahertz (MHz)) and/or larger time constants than those of short term memory effects. In some examples, time constants of the long-term memory effects are of the order of microseconds, milliseconds, or greater.

In some examples, a PA model with short term memory effects may include, for example, memory polynomial model and Volterra model. A DPD path implemented based on such a PA model with short term memory effect may be referred to as a short term memory effect DPD path.

In some examples, a DPD path implemented based on such a PA model with long term memory effects may be referred to as a long term memory effect DPD path. Such a DPD path may include one or more IIR filters to compensate for the long term memory effects of the PA.

In some examples, the PA 206 is associated with one or more PA models including, for example, memoryless PA model, PA model with short term memory effects, PA model with long term memory effects, or a combination thereof.

The DPD circuitry 202 may include a plurality of parallel DPD paths, where the DPD paths correspond to the plurality of PA models respectively. In an example, DPD circuitry 202 includes a plurality of parallel DPD paths including, for example, memoryless DPD path, short term memory effect DPD path, and/or long term memory effect DPD path.

In some examples, the PA 206 can be a gallium nitride (GaN) based PA, and the DPD circuitry 202 may be configured to compensate for long term memory effects of the GaN based PA. The GaN based PA can include a GaN high electron mobility transistor (GaN-HEMT). A GaN-HEMT may show long term memory effects due to its deep electron trap effects, where the density of its traps may change versus the output power of the GaN based PA. In some examples, a communication system using a GaN based PA is an LTE-TDD system. In such a communication system, the GaN based PA may be turned on during downlink time slots, and be turned off during uplink time slots. After the GaN based PA is turned on during downlink time slots, the deep electron traps may experience slow charging and discharging processes. As such, a non-linear behavior model of the GaN based PA changes slowly during this turning-on time period (transient period), even when the PA output power is constant. Further, while operating, the GaN PA semiconductor material characteristics change based on the changes to the power amplification circuitry 124. Accordingly, the non-linear behavior model of the GaN based PA experiences additional changes.

In some examples and as described in additional detail below, one or more IIR filters can be implemented in the DPD circuitry 202 to model the non-linear gain changes of the GaN based PA over the PA output power and the thermal effects and/or trapping effects of the GaN based PA. The long term memory effects of the GaN based PA may include, for example, a gate-lag effect, a drain-lag effect, and a thermal effect. A GaN based PA may have a plurality of long term memory effects (e.g., a gate lag effect and a drain lag effect) associated with the electron traps, because a plurality of energy levels may be involved in the trapping effects of the GaN based PA. As the operating temperature of the power amplification circuitry 124 increases, the thermal effects due to the change in the operating temperature alter the long term memory effects of the GaN based PA. Different IIR filters may be configured to compensate for different memory effects of the GaN based PA.

Additionally, non-linearity effects of a GaN based PA can result from changing time constants of responses of the GaN based PA due to the gate-lag effect and drain-lag effect. The gate-lag effect and drain-lag effect have been modeled in a gate-lag model and a drain-lag model, respectively. These models show that small signal responses of a GaN based PA can vary based on voltages applied in the PA. In these models, an RC time constant can change, which can, during operation, change a transfer function of the GaN based PA and introduce non-linearities.

Figure 3:
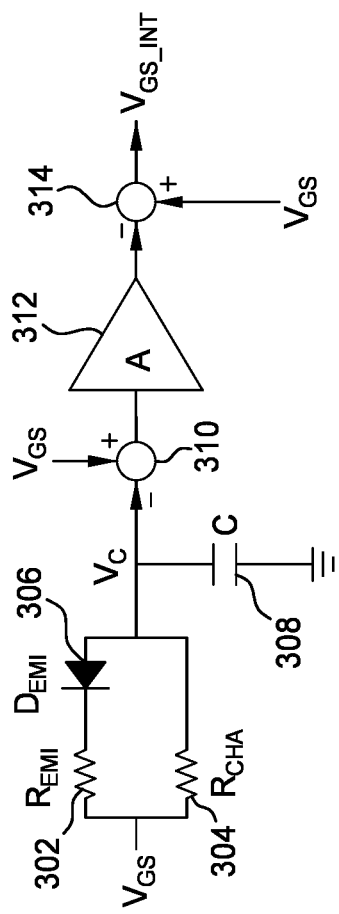
FIG. 3 illustrates a gate-lag model of a gallium nitride (GaN) based power amplifier (PA).

FIG. 3 illustrates a gate-lag model of a GaN based PA. An input node, on which a source-to-gate voltage $V_{GS}$ is applied, is connected to respective first terminals of resistor ($R_{EMI}$) 302 and resistor ($R_{CHA}$) 304. The second terminal of the resistor 302 (opposite from the first terminal) is connected to a cathode of a diode ($D_{EMI}$) 306. The second terminal of the resistor 304 (opposite from the first terminal) is connected to a anode of the diode 306, which is further connected to a first terminal of a capacitor (C) 308 and a negative input node of an subtractor 310. A capacitor voltage $V_C$ is on the node to which the anode of the diode 306, second terminal of the resistor 304, first terminal of the capacitor 308, and negative input node of the subtractor 310 are connected. A second terminal of the capacitor 308 is connected to a ground node. The source-to-gate voltage $V_{GS}$ is applied to a positive input node of the subtractor 310. An output node of the subtractor 310 is connected to an input node of an amplifier 312. An output node of the amplifier 312 is connected to a negative input node of a subtractor 314. The source-to-gate voltage $V_{GS}$ is applied to a positive input node of the subtractor 314. An output node of the subtractor 314 is an output node of the model on which an intermediate source-to-gate voltage $V_{GS\_INT}$ is applied.

As can be seen from this model in FIG. 3, whether the resistor ($R_{EMI}$) 302 forms part of the effective resistance of the model, and hence, forms part of the RC time constant of the model, depends on whether the source-to-gate voltage $V_{GS}$ is less than the capacitor voltage $V_C$. The capacitor 308 models the charge trapping effect in the model, and accumulated charge on the capacitor 308 results in the capacitor voltage $V_C$. An emission mode occurs when the source-to-gate voltage $V_{GS}$ is less than the capacitor voltage $V_C$ such that previously accumulated charge on the capacitor 308 is discharged. When the source-to-gate voltage $V_{GS}$ is less than the capacitor voltage $V_C$ in an emission mode, the diode 306 is conducting, and the effective resistance of the model is the resistance formed by the resistor ($R_{EMI}$) 302 and resistor ($R_{CHA}$) 304 being connected in parallel. A charging mode occurs when the source-to-gate voltage $V_{GS}$ is greater than the capacitor voltage $V_C$ such that the capacitor 308 accumulates charge. When the source-to-gate voltage $V_{GS}$ is not less than the capacitor voltage $V_C$ in a charging mode, the diode 306 is not conducting, and the effective resistance of the model is the resistance of resistor ($R_{CHA}$) 304. Mathematically, this can be generally expressed for a time constant T as follows:

$$V_{GS} < V_C: \tau = \tau_{EMI} = (R_{CHA} \| R_{EMI}) * C$$

$$V_{GS} \geq V_C: \tau = \tau_{CHA} = R_{CHA} * C$$

Figure 4:
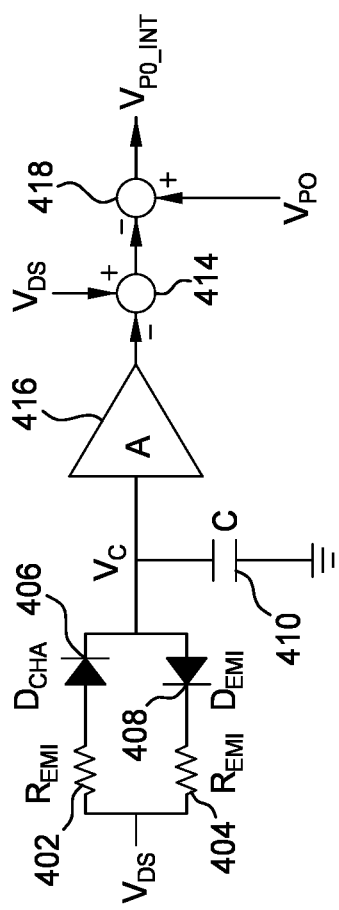
FIG. 4 illustrates a drain-lag model of a GaN based PA.

FIG. 4 illustrates a drain-lag model of a GaN based PA. An input node, on which a drain-to-source voltage $V_{DS}$ is applied, is connected to respective first terminals of resistor ($R_{CHA}$) 402 and resistor ($R_{EMI}$) 404. The second terminal of the resistor 402 (opposite from the first terminal) is connected to an anode of a diode ($D_{CHA}$) 406. The second terminal of the resistor 404 (opposite from the first terminal) is connected to a cathode of a diode ($D_{EMI}$) 408. A cathode of the diode 406 is connected to an anode of the diode 408, which is further connected to a first terminal of a capacitor (C) 410 and an input node of an amplifier 412. A capacitor voltage $V_C$ is on the node to which the cathode of the diode 406, anode of the diode 408, first terminal of the capacitor 410, and input node of an amplifier 412 are connected. A second terminal of the capacitor 410 is connected to a ground node. An output node of the amplifier 412 is connected to a negative input node of a subtractor 414. The drain-to-source voltage $V_{DS}$ is applied to a positive input node of the subtractor 414. An output node of the subtractor 414 is connected to an input node of an amplifier 416. An output node of the amplifier 416 is connected to a negative input node of a subtractor 418. A voltage $V_{P0}$ is applied to a positive input node of the subtractor 418. An output node of the subtractor 418 is an output node of the model on which an intermediate voltage $V_{P0\_INT}$ is applied.

As can be seen from this model in FIG. 4, whether the resistor ($R_{CHA}$) 402 and resistor ($R_{EMI}$) 404 form part of the effective resistance of the model, and hence, forms part of the RC time constant of the model, depends on whether the drain-to-source voltage $V_{DS}$ is less than or greater than the capacitor voltage $V_C$. The capacitor 410 models the charge trapping effect in the model, and accumulated charge on the capacitor 410 results in the capacitor voltage $V_C$. An emission mode occurs when the drain-to-source voltage $V_{DS}$ is less than the capacitor voltage $V_C$ such that previously accumulated charge on the capacitor 410 is discharged. When the drain-to-source voltage $V_{DS}$ is less than the capacitor voltage $V_C$ in an emission mode, the diode 406 is not conducting, and the diode 408 is conducting. Under such circumstances, the effective resistance of the model is the resistance of the resistor ($R_{EMI}$) 404. A charging mode occurs when the drain-to-source voltage $V_{DS}$ is greater than the capacitor voltage $V_C$ such that the capacitor 410 accumulates charge. When the capacitor voltage $V_C$ is less than drain-to-source voltage $V_{DS}$ in a charging mode, the diode 406 is conducting, and the diode 408 is not conducting. Under such circumstances, the effective resistance of the model is the resistance of resistor ($R_{CHA}$) 402. Mathematically, this can be generally expressed for a time constant T as follows:

$$V_{DS} < V_C: \tau = \tau_{EMI} = R_{EMI} * C$$

$$V_{DS} > V_C: \tau = \tau_{CHA} = R_{CHA} * C$$

Figure 5:
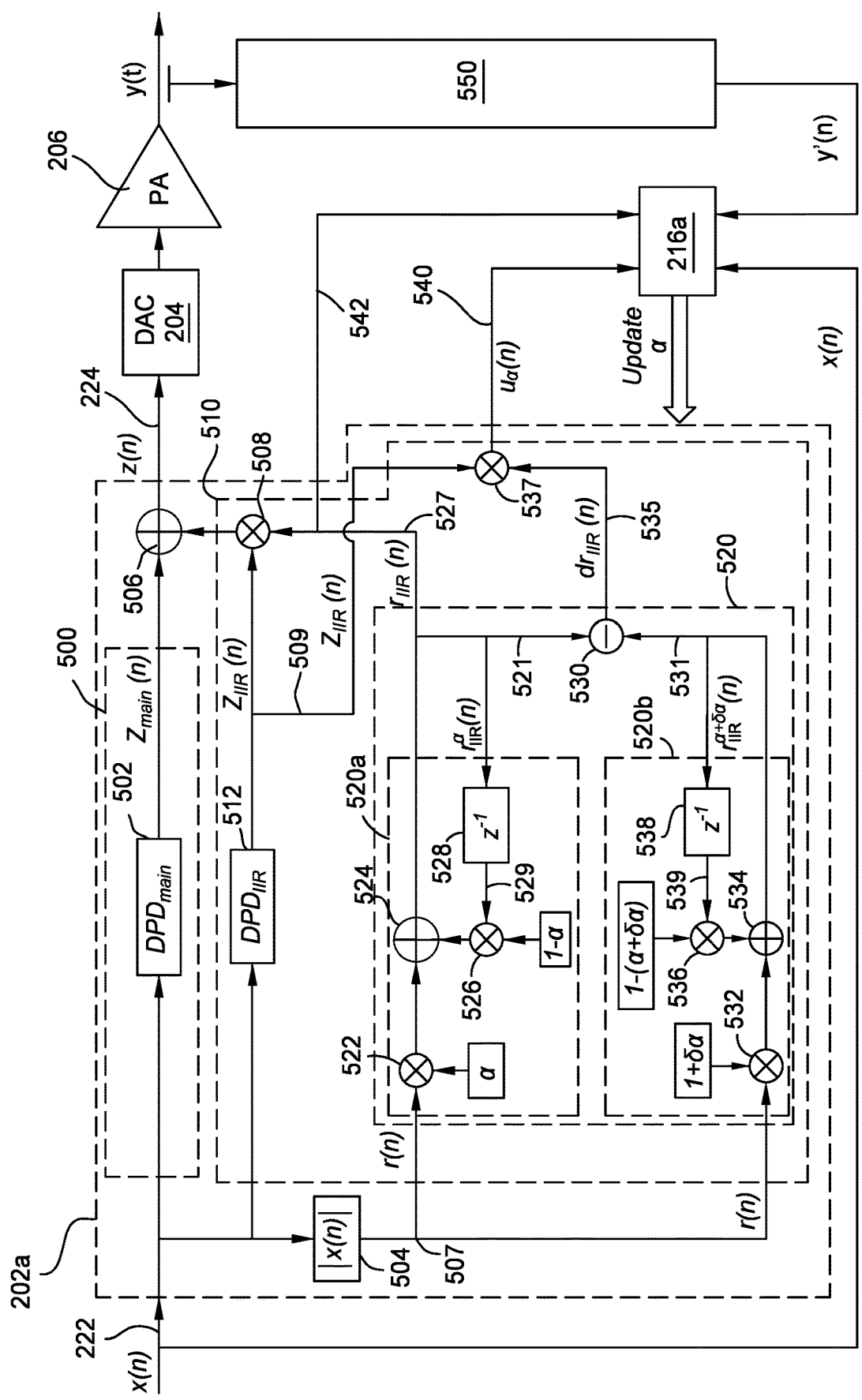
FIG. 5 is a schematic of DPD circuits that can be implemented as a DPD circuit according to some examples.

FIG. 5 illustrates DPD circuitry 202a implemented to compensate for effects in the PA 206. The DPD circuitry 202a pre-distorts an input signal x(n) according to a predetermined model. The DPD circuitry 202a includes one or more paths (e.g., paths 500, and 510). The signals output by paths of the DPD circuitry 202a are combined (e.g., multiplied and/or summed) to form the digital intermediate signal z(n). In the example of FIG. 5, the DPD circuitry 202a includes two parallel DPD paths 500 and 510. In other examples, the DPD circuitry 202a may include more than two parallel DPD paths. Further, the DPD circuitry 202a includes magnitude logic 504 and an adder 506.

The DPD path 500 compensates for short term memory effects of the PA 206. The DPD path 500 may also be referred to as main DPD path. The DPD path 500 includes DPD sub-circuit 502. An input node of the DPD sub-circuit 502 receives the input signal x(n) via the input node 222, and an output node of the DPD sub-circuit 502 is electrically connected to an input node of the adder 506.

The DPD sub-circuit 502 receives the digital input signal x(n) and processes the digital input signal x(n) to compensate for the short term memory effects. The DPD sub-circuit 502 outputs a distorted signal $z_{main}$(n) to the respective input node of the adder 506. The DPD sub-circuit 502 may be implemented based on a memory polynomial model to compensate for short term memory effects of the PA 206. Such short term memory effects may be caused by reactive components of active devices and matching networks of the PA 206.

The adaptation circuitry 216a adaptively configures the DPD sub-circuit 502 (e.g., to model the short term memory effects of the PA 206) via one or more parameters and/or coefficients of the DPD sub-circuit 502. The one or more parameters and/or coefficients may be stored within the parameter buffer 218. For example, one or more parameters may include one or more coefficients for a memory polynomial model used by the DPD sub-circuit 502.

The magnitude logic 504 and the DPD path 510 compensate for long term memory effects of the PA 206 and changes to effective time constants of the PA 206.

An input node of the magnitude logic 504 is electrically coupled to the input node 222 and receives the digital input signal x(n). The magnitude logic 504 generates a magnitude signal r(n) (or |x(n)|) from the digital input signal x(n). The magnitude signal r(n) is a magnitude of the input signal x(n). The magnitude signal r(n) is output to the node 507. The magnitude logic 504 (and any magnitude logic subsequently described) can determine the magnitude signal r(n) by determining the square root of the sum of the real part of the signal input to the magnitude logic 504 squared and the imaginary part of the signal input to the magnitude logic 504 squared (e.g., generally, $|x| = \sqrt{(Re\{x\})^2 + (Im\{x\})^2}$). In other examples, the magnitude logic 504 determines the magnitude signal r(n) through other methods.

The DPD path 510 includes a DPD sub-circuit 512, one or more IIR filters 520, and multiplier 508. The DPD sub-circuit 512 receives the digital input signal x(n), process the digital input signal x(n) to compensate for memoryless or short term memory effects, and outputs a distorted signal $z_{IIR}(n)$ to a respective input node of the multiplier 508 that is coupled to an output node of the DPD sub-circuit 512. Further, the DPD sub-circuit 512 outputs the distorted signal $z_{IIR}(n)$ to the node 509.

The DPD sub-circuit 512 is implemented based on a memoryless and/or memory polynomial model or Volterra model to compensate for memoryless and/or short term memory effects of the PA 206. The adaptation circuitry 216a adaptively configures the DPD sub-circuit 512 via one or more parameters of the DPD sub-circuit 512. The one or more parameters are stored in the parameter buffer 218. The one or more parameters include one or more coefficients for a memory polynomial model used by the DPD sub-circuit 512.

The one or more IIR filters 520 receives the magnitude signal r(n) and passes the magnitude signal r(n) through the one or more transfer functions of the one or more IIR filters 520. Further, the one or more IIR filters 520 outputs a digital response signal $r_{IIR}(n)$ to the node 527 and the response signal $r_{IIR}(n)$ to an input node of the multiplier 508. The transfer function of each of the one or more IIR filters 520 implements one or more parameters that compensate for memory effects of the PA 206. As illustrated in FIG. 5, the one or more IIR filters 520 utilizes the parameter $\alpha$ and the parameter $\delta\alpha$ to compensate for memory effects of the PA 206. In other examples, the one or more IIR filters 520 utilizes other parameters to compensate for memory effects of the PA 206.

In some examples, the adaptation circuitry 216a adaptively configures the one or more IIR filters 520. For example, the adaptation circuitry 216a adaptively configures the one or more IIR filters 520 via one or more parameters, which can be stored in the parameter buffer 218. The one or more parameters may be a coefficient of various functions, for example, functions that modify the input digital signal x(n) such that distortions within the PA 206 are offset. In one example, the one or more parameters may be coefficients for a memory polynomial model used by the one or more IIR filters 520.

The one or more IIR filters 520 includes an IIR filter 520a and an IIR filter 520b. The IIR filter 520a includes a multiplier 522, an adder 524, a multiplier 526 and a delay unit 528. The magnitude signal r(n) is received at an input node of the multiplier 522 via the node 507. The multiplier 522 multiplies the magnitude signal r(n) with parameter $\alpha$, generating signal $\alpha*r(n)$. The signal $\alpha*r(n)$ generated by the multiplier 522 is output to an input node of the adder 524. The adder 524 further receives an output of the multiplier 526 via a respective input node. The adder 524 generates the response signal $r_{IIR}^{\alpha}(n)$ (or $r_{IIR}(n)$) from the output signal of the multiplier 522 and the output signal of the multiplier 526. The delay unit 528 receives the signal $r_{IIR}^{\alpha}(n)$ via an input node electrically connected to the node 527. The delay unit 528 outputs a delayed signal via an output node of the delay unit 528 onto the node 529. For example, the delay unit 528 delays the signal $r_{IIR}^{\alpha}(n)$ by one or more time periods. In some examples, the delay unit 528 delays the signal $r_{IIR}^{\alpha}(n)$ by one time period $z^{-1}$. In such examples, the delayed response signal $r_{IIR}^{\alpha}(n)*z^{-1}=r_{IIR}^{\alpha}(n-1)$ is output by the delay unit 528.

The delay unit 528 includes one or more buffers, one or more flip-flops, or the like, which further can have multiple taps that are selectable to output a signal with a desired delay. An input node of the multiplier 526 receives the delayed signal $r_{IIR}^{\alpha}(n)*z^{-1}$ via the node 529. The multiplier 526 multiplies the delayed signal with "$1-\alpha$" to produce signal $(1-\alpha)*r_{IIR}^{\alpha}(n)*z^{-1}$.

The multiplier 508 receives the signal $z_{IIR}(n)$ from an output node of the DPD sub-circuit 512 and the signal $r_{IIR}(n)$ from the node 527 via respective input nodes. The multiplier 508 multiplies the signals $z_{IIR}(n)$ and $r_{IIR}(n)$ with each other, generating $z_{IIR}(n)*r_{IIR}(n)$. The output signal of the multiplier 508 is output via an output node of the multiplier 508 to an input node of the adder 506. The adder 506 adds the signal $z_{main}(n)$ received from an output node of the DPD sub-circuit 502 with the output signal of the multiplier 508 (e.g., $z_{IIR}(n)*r_{IIR}(n)$) provided by the multiplier 508 and generates signal z(n) which is provided to intermediate node 224.

The IIR filter 520b includes a multiplier 532, an adder 534, a multiplier 536 and a delay unit 538. The magnitude signal r(n) is received at an input node of the multiplier 532 via the node 507, which multiplies the magnitude signal r(n) with parameter $\alpha+\delta\alpha$, generating signal $(\alpha+\delta\alpha)*r(n)$. In the parameter $\alpha+\delta\alpha$, $\delta\alpha$ corresponds to a time constant difference between the IIR filters 520a and 520b. In one example, time constant $\delta$ is about 0.01. In other examples, time constant $\delta$ is greater than or less than about 0.01. As is noted above, the time constant $\delta$ is stored within the parameter buffer 218. Further, the time constant $\delta$ may be generated by modeling the circuit elements of the IIR filters 520. In other example, the time constant $\delta$ is determined based on circuit elements of an average IIR filter 520. Further, the time constant $\delta$ may be based on a response of the one or more IIR filters 520, and/or a response of an average IIR filter.

The signal $(\alpha+\delta\alpha)*r(n)$ generated by the multiplier 532 is output to an input node of the adder 534. The adder 534 further receives an output of the multiplier 536 via a respective input node. The adder 534 generates the response signal $r_{IIR}^{\alpha+\delta\alpha}(n)$ from the output signal of the multiplier 532 and the output signal of the multiplier 536. The delay unit 538 receives the signal $r_{IIR}^{\alpha+\delta\alpha}(n)$ via an input node electrically connected to the output of the adder 534. The delay unit 538 outputs a delayed signal via an output node of the delay unit 538 onto the node 539. For example, the delay unit 538 delays the response signal $r_{IIR}^{\alpha+\delta\alpha}(n)$ by one or more time periods. In some examples, the delay unit 538 delays the response signal $r_{IIR}^{\alpha+\delta\alpha}(n)$ by one time period $z^{-1}$. In such examples, the delayed response signal $r_{IIR}^{\alpha+\delta\alpha}(n)*z^{-1}=r_{IIR}^{\alpha+\delta\alpha}(n-1)$ is output by the delay unit 538. The delay unit 538 includes one or more buffers, one or more flip-flops, or the like, which further can have multiple taps that are selectable to output a signal with a desired delay. An input node of the multiplier 536 receives the delayed signal $r_{IIR}^{\alpha+\delta\alpha}(n)*z^{-1}$ via the node 529. The multiplier 536 multiplies the delayed signal with "$1-(\alpha+\delta\alpha)$" to produce signal $(1-(\alpha+\delta\alpha))*r_{IIR}^{\alpha+\delta\alpha}(n)*z^{-1}$.

The subtractor 530 receives an output from the one or more IIR filters 520 via nodes 521 and 531. For example, the subtractor 530 receives the response signal $r_{IIR}^{\alpha}(n)$ via the node 521 and the response signal $r_{IIR}^{\alpha+\delta\alpha}$ via the node 531. The subtractor 530 generates the response signal $dr_{IIR}(n)$ based on the response signal $r_{IIR}^{\alpha}(n)$ via the node 521 and the response signal $r_{IIR}^{\alpha+\delta\alpha}$. For example, the subtractor 530 subtracts the response signal $r_{IIR}^{\alpha+\delta\alpha}$ from the response signal $r_{IIR}^{\alpha}(n)$ to generate the response signal $dr_{IIR}(n)$.

The multiplier 537 receives the signal $z_{IIR}(n)$ from an output node 509 of the DPD sub-circuit 512 and the signal dr$_{IIR}$(n) from the output node 535 of the subtractor 530 via respective input nodes. The multiplier 537 multiplies the signals z$_{IIR}$(n) and dr$_{IIR}$(n) with each other, generating z$_{IIR}$(n)*dr$_{IIR}$(n). The output signal of the multiplier 537 is output to the adaptation circuitry 216a via node 540 of the multiplier 537. The output signal of the multiplier 537 may be referred to as an adjustment signal u$_\alpha$.

The adjustment signal u$_\alpha$ is compared against input signal x(n) and at least a portion of the response signal y(n) to determine whether to update the parameter $\alpha$.

The adaptation circuitry 216a function similar to as the adaptation circuitry 216 of FIG. 2. The adaptation circuitry 216a receives the adjustment signal u$_\alpha$ from the node 540 at a first input node, the digital input signal x(n) from the node 222 via a second input node, and the response signal y'(n) from the signal processing circuitry 550 via a third input node. As is described with regard to FIG. 2, the signal processing circuitry 550 receives the output signal y(t) and generates the response signal y'(n) from the output signal y(t). The signal processing circuitry 550 includes one or more of the attenuation circuitry 208, ADC 210, gain calibration circuitry 212, and alignment circuitry 214 as is described with regard to FIG. 2.

The adaptation circuitry 216a generates an updated parameter $\alpha'$ from the adjustment signal u$_\alpha$, the digital input signal x(n), and the response signal y'(n). The adaptation circuitry 216a adjusts parameter $\alpha$ such that a difference (error) between response signal y'(n) and digital input signal x(n) is mitigated. Changes in operating temperature result in a difference between the digital input signal x(n) and the response signal y'(n). For example, error(n)=x(n)−y'(n). Further, the larger the difference (error) between digital input signal x(n) and response signal y'(n) with reference to u$_\alpha$, the more parameter $\alpha$ is adjusted.

In one or more examples, the DPD output error due to a change in a value of a is:

$$\Delta z(n) = z_{IIR}(n) * \frac{\partial r_{IIR}(n)}{\partial \alpha} * \Delta \alpha,$$

$$\frac{\partial r_{IIR}(n)}{\partial \alpha} = \lim_{\delta \alpha \to 0} \frac{r_{IIR}^{\alpha+\delta\alpha}(n) - r_{IIR}^{\alpha}(n)}{\delta \alpha} \cong \frac{r_{IIR}^{\alpha+\delta\alpha}(n) - r_{IIR}^{\alpha}(n)}{\delta \alpha},$$

$$\Delta z(n) = z_{IIR}(n) * \left( r_{IIR}^{\alpha+\delta\alpha}(n) - r_{IIR}^{\alpha}(n) \right) * \frac{\Delta \alpha}{\delta \alpha}.$$

In the above, $\Delta\alpha$ is adapted and $\delta\alpha$ is a fixed value based on the corresponding IIR filter. Further, as is noted above, response signals r$_{IIR}^\alpha$(n) and r$_{IIR}^{\alpha+\delta\alpha}$(n), are the response signals from different IIR filters (e.g., the IIR filters 520a and 520b) with different time constants, e.g. a different time constant $\delta$. In one example, the different IIR filters (e.g., IIR filters 520a and 520b) may be executed by a common IIR hardware circuit. In another example, the different IIR filters are executed by different respective IIR hardware circuits.

Further, let u$_\alpha$(n)=z$_{IIR}$(n)*(r$_{IIR}^{\alpha+\delta\alpha}$(n)−r$_{IIR}^\alpha$(n)), the error between the analog output signal y(t) of the PA 206 and the digital input signal x(n) is:

$$\text{error}(n) = u_\alpha(n) * \frac{\Delta\alpha}{\delta\alpha},$$

where $$\Delta\alpha = \delta\alpha * \text{real}\left( \frac{\sum_{n=1}^{N} u_\alpha^*(n) * \text{error}(n)}{\sum_{n=1}^{N} u_\alpha^*(n) * u_\alpha(n)} \right),$$

for N observed samples.

In the above equation, u$_\alpha$*(n) is the conjugate of the adjustment signal u$_\alpha$(n). The adjusted parameter is determined based on:

$$\alpha_{1+i} = \alpha_i + \Delta\alpha$$

Figure 6:
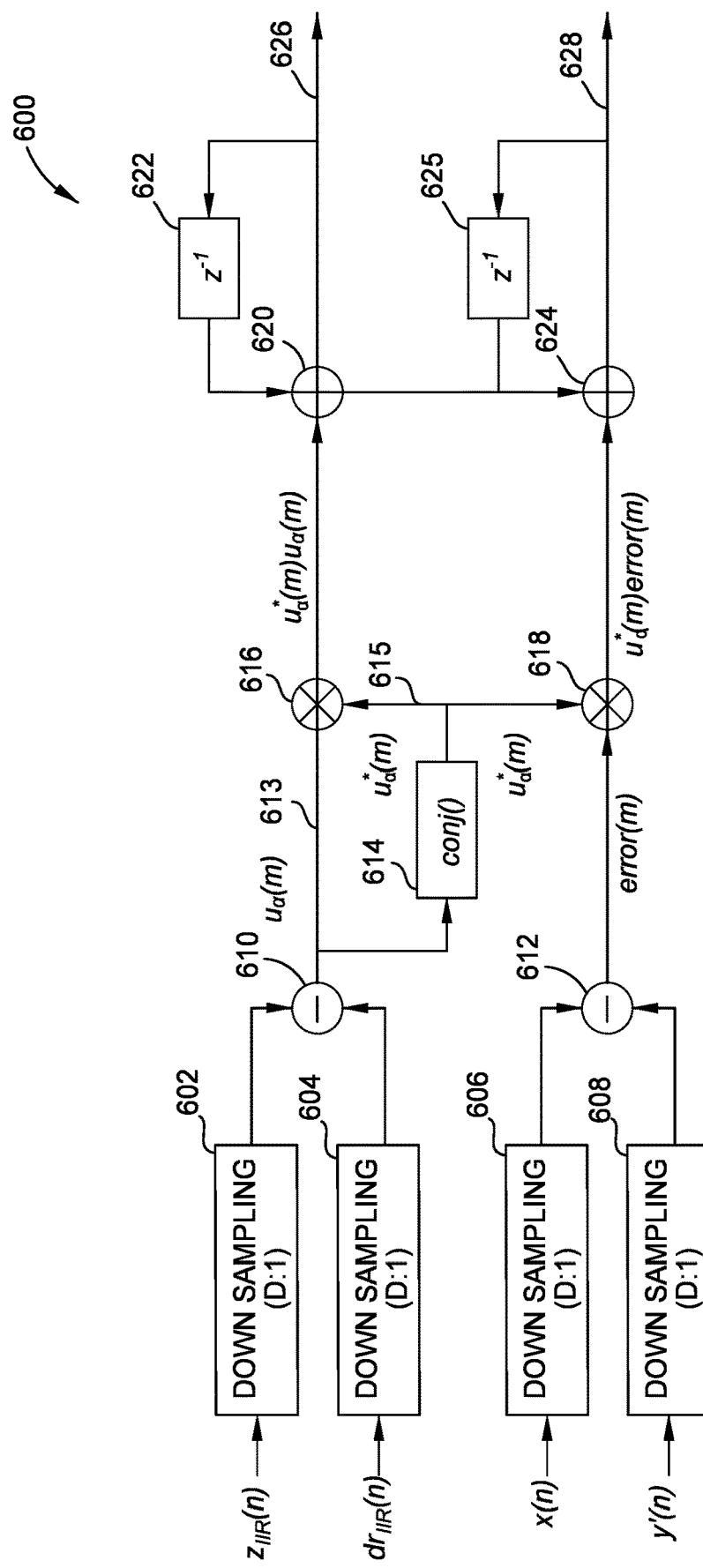
FIG. 6 is a schematic of an adjustment circuitry according to some examples.

FIG. 6 illustrates example circuitry of adaptation circuitry 600. The adaptation circuitry 600 may be implemented as the adaptation circuitry 216a of FIG. 5. The adaptation circuitry 216a includes down samplers 602, 604, 606, and 608, multiplier 610, subtractor 612, conjugate circuit block 614, multiplier 616, multiplier 618, adder 620, adder 624, delay unit 622, and delay unit 625. In one example, the multiplier 610 is the multiplier 537 of FIG. 5. In such an example, the multiplier 610 is external to the adaptation circuitry 600.

The down samplers 602, 604, 606, and 608 down sample respective received signals by D to 1. D is an integer of greater than 1. In one example, D is 10, 100, 1000, or more. The down sampling amount corresponds to amount of noise of the circuit elements of the DPD circuitry 202a and/or the power amplification circuitry 124. In one example, each down sampler 602, 604, 606, 608 down samples an input signal by a common amount. In another example, one or more of the down samplers 602, 604, 606, 608 down samples an input signal by an amount different than that of another one or more of the down samplers.

With regard to FIG. 5, the input to the down sampler 602 may be disposed between DPD sub-circuit 512 and the multiplier 537. The down sampler 602 receives the signal z$_{IIR}$(n) from the node 509. The input to the down sampler 602 is electrically connected to the node 509. The down sampler 602 down samples the signal z$_{IIR}$(n) to generate down sampled signal z$_{IIR}$(n). The input to the down sampler 604 receives the signal dr$_{IIR}$(n) from the node 535. With regard to FIG. 5, the down sampler 604 may be positioned between the subtractor 530 and the multiplier 537. The input to the down sampler 604 is electrically connected to the node 535. The down sampler 604 down samples the signal dr$_{IIR}$(n) to generate down sampled signal dr$_{IIR}$(n).

The input to the down sampler 606 receives the input signal x(n) from the node 222. With regard to FIG. 5, the down sampler 606 may be positioned between the adaptation circuitry 216a and the node 222. The input to the down sampler 606 is electrically connected to the node 222. The down sampler 606 down samples the input signal x(n) to generate down sampled input signal x(n). The input to the down sampler 608 receives the response signal y'(n) from an output of the signal processing circuitry 550. With regard to FIG. 5, the down sampler 606 may be positioned between the signal processing circuitry 550 and the adaptation circuitry 216a. The input to the down sampler 608 is electrically connected to the output of the signal processing circuitry 550. The down sampler 608 down samples the response signal y'(n) to generate down sampled response signal y'(n).

The outputs of the down samplers 602 and 604 are electrically connected to the inputs of the multiplier 610 of FIG. 6. The multiplier 610 multiplies the down sampled signal $z_{IIR}(n)$ received from the down sampler 602 with the down sampled signal $dr_{IIR}(n)$ received from the down sampler 604 to generate adjustment signal $u_\alpha(m)$. The conjugate circuit block 614 receives the adjustment signal $u_\alpha(m)$ and generates the conjugate signal $u_\alpha^*(m)$, and outputs the conjugate signal $u_\alpha^*(m)$ on node 615. The multiplier 616 receives the adjustment signal $u_\alpha(m)$ from the node 613 and receives the conjugate signal $u_\alpha^*(m)$ from the node 615. The multiplier 616 multiplies the adjustment signal $u_\alpha(m)$ with the conjugate signal $u_\alpha^*(m)$ to generate the signal $u_\alpha^*(m)u_\alpha(m)$. The output node of the multiplier 616 is electrically coupled to an input node of the adder 620. Further, another input node of the adder 620 is electrically coupled to an output node of the delay unit 622 and receives a delayed response signal $$\left(\sum_{m=1}^{M} u_\alpha^*(m)u_\alpha(m)\right)z^{-1} = \sum_{m=1}^{M-1} u_\alpha^*(m)u_\alpha(m).$$

The adder 620 generates summation signal $$\sum_{m=1}^{M} u_\alpha^*(m)u_\alpha(m)$$

by adding the delayed response signal $$\sum_{m=1}^{M-1} u_\alpha^*(m)u_\alpha(m) \text{ with the signal } u_\alpha^*(m)u_\alpha(m).$$

The summation signal $$\sum_{m=1}^{M} u_\alpha^*(m)u_\alpha(m)$$

is output on node 626.

The delay unit 622 outputs the delayed response signal $$\left(\sum_{m=1}^{M} u_\alpha^*(m)u_\alpha(m)\right)z^{-1}.$$

For example, the delay unit 622 delays the output of the adder 620 by one or more time periods. In one example, the delay unit 622 delays the output of the adder 620 by one time period $z^{-1}$.

The subtractor 612 receives the down sampled digital input signal $x(n)$ from the down sampler 606 and the down sampled response signal $y'(n)$ from the down sampler 608 via first and second input nodes. The subtractor 612 subtracts the down sampled response signal $y'(n)$ from the down sampled digital input signal $x(n)$ to generate the error signal error(m). An input node of the multiplier 618 receives the error signal error(m) from an output node of the subtractor 612 and the conjugate signal $u_\alpha^*(m)$ from the node 615. The multiplier 618 multiplies the error signal error(m) with the conjugate signal $u_\alpha^*(m)$ to generate the signal $u_\alpha^*(m)$error(m). An output node of the multiplier 618 is electrically connected to an input node of the adder 624. Further, another input node of the adder 624 is electrically coupled to an output node of the delay unit 625 and receives a delayed response signal $$\left(\sum_{m=1}^{M} u_\alpha^*(m)\text{error}(m)\right)z^{-1} = \sum_{m=1}^{M-1} u_\alpha^*(m)\text{error}(m).$$

The adder 624 generates summation signal $$\sum_{m=1}^{M} u_\alpha^*(m)\text{error}(m)$$

by adding the delayed response signal $$\sum_{m=1}^{M-1} u_\alpha^*(m)\text{error}(m)$$

with the signal $u_\alpha^*(m)$error(m). The summation signal $$\sum_{m=1}^{M} u_\alpha^*(m)\text{error}(m)$$

is output on node 628.

The adaptation circuitry 216a determines the updated parameter $\Delta\alpha$ based on the signal output on the node 626 and the signal output on the node 628. The updated parameter $\Delta\alpha$, is determined based on $\delta\alpha^*(A/B)$, where B is $$\sum_{m=1}^{M} u_\alpha^*(m)u_\alpha(m)$$

(e.g., output on the node 626) and A is $$\sum_{m=1}^{M} u_\alpha^*(m)\text{error}(m)(\text{e.g.,}$$

output on the node 628).

Figure 7:
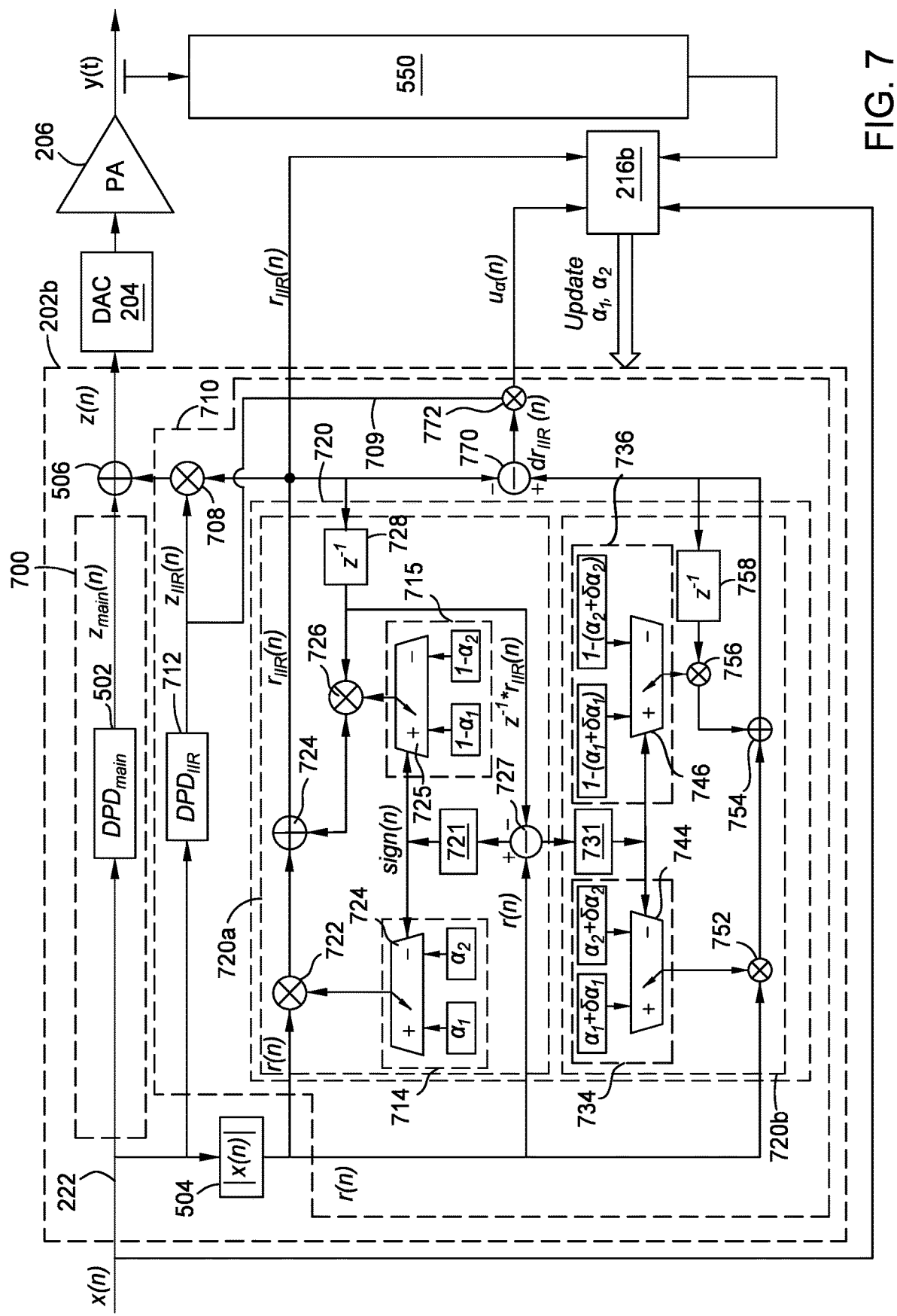
FIG. 7 is a schematic of DPD circuits that can be implemented as a DPD circuit according to some examples.

FIG. 7 illustrates a DPD circuitry 202b implemented to compensate for effects in the PA 206. The DPD circuitry 202b pre-distorts a signal according to a predetermined model. Further, the signals output by DPD paths 700 and 710 are multiplied and/or added to form the digital intermediate signal $z(n)$. The DPD circuitry 202b includes parallel DPD paths 700 and 710, magnitude logic 504, and an adder 506. The path 700 is similar to the path 500 of FIG. 5. For example, the DPD path 700 includes DPD sub-circuit 502 having an output node electrically connected to an input node of the adder 506.

The DPD path 710 includes DPD sub-circuit 712, and one or more IIR filters 720. The DPD sub-circuit 712 is configured similar to that of the DPD sub-circuit 512 of FIG. 5. For example, an output node of the DPD sub-circuit 712 is electrically connected to an input node of the multiplier 708 and generates a pre-distorted signal from input signal $x(n)$ received via node 222. Further, the output of the DPD sub-circuit 712 is electrically connected to an input node of the multiplier 772.

The one or more IIR filters 720 includes selection circuitry configured to select between one or more parameters. In one example, the one or more IIR filters 720 includes an IIR filter 720a and an IIR filter 720b. In other example, the one or more IIR filters 720 include more than or less than two IIR filters. The IIR filter 720a includes selection circuit 714, selection circuit 715, sign bit determination circuit 721, multiplier 722, adder 723, multiplier 726, subtractor 727, and delay unit 728.

The IIR filter 720b includes selection circuit 734, selection circuit 736, sign bit determination circuit 731, multiplier 752, adder 754, multiplier 756, and delay unit 758.

The selection circuit 714 includes a multiplexer 724, and the selection circuit 715 includes a multiplexer 725. Respective control input nodes of the multiplexers 724, 725 are electrically connected to the output node of the sign bit determination circuit 721 and receive the sign bit output by the sign bit determination circuit 721.

A first input node of the multiplexer 724 is coupled to a storage element of the parameter buffer 218 that stores the parameter $\alpha_1$, and a second input node of the multiplexer 724 is coupled to a storage element of the parameter buffer 218 that stores the parameter $\alpha_2$. The storage element is a memory element, such as static random access memory (SRAM), of the parameter buffer 218. An output node of the multiplexer 724 is the output node of the first selection circuit 714 and is coupled to the respective input node of the multiplier 722.

The multiplexer 724 outputs the signal on the first input node of the multiplexer 724 (e.g., the first alpha parameter $\alpha_1$) when the signal on the control input node of the multiplexer 724 is "0" (e.g., when the sign bit is "0") and is configured to output the signal on the second input node of the multiplexer 724 (e.g., the second alpha parameter $\alpha_2$) when the signal on the control input node of the multiplexer 724 is "1" (e.g., when the sign bit is "1"). The first alpha parameter $\alpha_1$ differs from the second alpha parameter $\alpha_2$. For example, the first alpha parameter $\alpha_1$ may be greater than or less than the second alpha parameter $\alpha_2$. Further, the first and second alpha parameters $\alpha_1$, $\alpha_2$ may be based on different circuit characteristics and/or thermal changes.

A first input node of the multiplexer 725 is coupled to a storage element of the parameter buffer 218 that stores the parameter "$1-\alpha_1$", and a second input node of the multiplexer 725 is coupled to a storage element of the parameter buffer 218 that stores the parameter "$1-\alpha_2$". An output node of the multiplexer 725 is the output node of the second selection circuit 715 and is electrically connected to the respective input node of the multiplier 726. The multiplexer 725 outputs the signal on the first input node of the multiplexer 725 (e.g., the first beta parameter $1-\alpha_1$) when the signal on the control input node of the multiplexer 725 is "0" (e.g., when the sign bit is "0") and outputs the signal on the second input node of the multiplexer 725 (e.g., the second beta parameter $1-\alpha_1$) when the signal on the control input node of the multiplexer 725 is "1" (e.g., when the sign bit is "1").

The subtractor 727 is configured to subtract the delayed digital response signal $z^{-1}*r_{IIR}(n)$ from the magnitude signal $r(n)$ to obtain a difference signal $r(n)-z^{-1}*r_{IIR}(n)$, and to output the difference signal $r(n)-z^{-1}*r_{IIR}(n)$ to the sign bit determination circuit 721. Further, the difference signal $r(n)-z^{-1}*r_{IIR}(n)$ is output to the sign bit determination circuit 731.

The sign bit determination circuit 721 is configured to identify and output the sign bit of the difference signal $r(n)-z^{-1}*r_{IIR}(n)$ to the first selection circuit 714 and the second selection circuit 715. The sign bit determination circuit 721 can be any connection and/or logic (e.g., a comparator) that propagates the sign bit of the difference signal $r(n)-z^{-1}*r_{IIR}(n)$. Hence, when the magnitude signal $r(n)$ is greater than the digital response signal $z^{-1}*r_{IIR}(n)$, the sign bit of the difference signal $r(n)-z^{-1}*r_{IIR}(n)$ is "0", which is output to the first selection circuit 714 and the second selection circuit 715. When the digital response signal $z^{-1}*r_{IIR}(n)$ is greater than the magnitude signal $r(n)$, the sign bit of the difference signal $r(n)-z^{-1}*r_{IIR}(n)$ is "1", which is output to the first selection circuit 714 and the second selection circuit 715.

The first selection circuit 714 is configured to selectively output a first parameter $\alpha_1$ or a second parameter $\alpha_2$ based on whether the sign bit output by the sign bit determination circuit 721 is "0" or "1". Similarly, the second selection circuit 715 is configured to selectively output a third parameter $1-\alpha_1$ or a fourth parameter $1-\alpha_2$ based on whether the sign bit output by the sign bit determination circuit 721 is "0" or "1". When the sign bit is "0", the first selection circuit 714 and the second selection circuit 715 output the first and third fourth parameters $\alpha_1$, $1-\alpha_1$, respectively. When the sign bit is "1", the first selection circuit 714 and the second selection circuit 716 output the second parameters $\alpha_2$, $1-\alpha_2$, respectively. Other configurations can be implemented, such as by switching when parameters are selectively output.

As indicated, the sign bit is "0" when the magnitude signal $r(n)$ is greater than the digital response signal $z^{-1}*r_{IIR}(n)$, which further indicates that the PA 206 will be in a charging mode with respect to the gate-lag model and the drain-lag model. Hence, the first alpha parameter $\alpha_1$ that is output when the sign bit is "0" corresponds to the time constant of the charging mode (e.g., $\tau=\tau_{CHA}=R_{CHA}*C$, with values of $R_{CHA}$ and C depending on whether the IIR filter is modeled for the gate-lag model or the drain-lag model). As indicated, the sign bit is "1" when the digital response signal $z^{-1}*r_{IIR}(n)$ is greater than the magnitude signal $r(n)$, which further indicates that the PA 206 will be in an emission mode with respect to the gate-lag model and the drain-lag model. Hence, the second alpha parameter $\alpha_2$ that is output when the sign bit is "1" corresponds to the time constant of the emission mode (e.g., $\tau=\tau_{EMI}=(R_{CHA}\| R_{EMI})*C$ or $\tau=\tau_{EMI}=R_{EMI}*C$, depending on whether the IIR filter is modeled for the gate-lag model or the drain-lag model, respectively).

In one or more examples, selectively outputting the first or second alpha parameters $\alpha_1$, $\alpha_2$, implements the selected alpha parameter in the transfer function of the IIR filter (e.g., IIR filter 720a, 720b). The IIR filter is configured to compensate for the different time constants of the charging mode and emission mode of the given model. Similarly, selectively outputting the parameters $1-\alpha_1$, $1-\alpha_2$ implements the selected parameter in the transfer function of the IIR filter (e.g., IIR filter 720a, 720b). The IIR filter is configured to compensate for the different time constants of the charging mode and emission mode of the given model.

The signal output by the multiplexer 724 is received at a first input node of the multiplier 722. A second input node of the multiplier 722 receives the magnitude signal $r(n)$ generated by the magnitude logic 504 from input digital signal $x(n)$. The multiplier 722 multiplies the magnitude signal $r(n)$ with the output of the multiplexer 724.

The signal output by the multiplexer 725 is received at an input node of the multiplier 726. A second input node of the multiplier 726 receives an output signal from an output node the delay unit 728. The multiplier 726 multiplies the output signal of the multiplexer 725 with the output signal (delayed digital response signal $r_{IIR}(n-1)$ or $z^{-1}*r_{IIR}(n)$ of the delay unit 728.

The adder 723 receives, at a first input node, the output signal of the multiplier 722, and, at a second input node, the output signal of the multiplier 726. The adder 723 adds the corresponding output signal to generate the response signal $r_{IIR}(n)$.

An input node of the delay unit 728 is electrically connected to an output node of the adder 723 and receives the response signal $r_{IIR}(n)$. The delay unit 728 generates the delayed digital response signal $r_{IIR}(n-1)$ or $z^{-1}*r_{IIR}(n)$ from the response signal $r_{IIR}(n)$.

A first input node of the multiplier 708 is electrically connected to the output node of the adder 723 and receives the response signal $r_{IIR}(n)$. A second input node of the multiplier 708 is electrically connected to the output node of the DPD sub-circuit 712 and multiplies the output signal $z_{IIR}(n)$ generated by the DPD sub-circuit 712 with the response signal $r_{IIR}(n)$.

A first input node of the adder 506 is electrically connected to an output node of the DPD sub-circuit 502, and a second input node of the adder 506 is electrically connected to an output node of the multiplier 708. The adder 506 adds the output signal generated by the DPD sub-circuit 502 with the output signal of the multiplier 708 to generate digital signal z(n).

The IIR filter 720b includes the selection circuit 734, selection circuit 736, the sign bit determination circuit 731, the multiplier 752, the adder 754, the multiplier 756, and the delay unit 758.

The selection circuit 734 includes a multiplexer 744, and the selection circuit 736 includes a multiplexer 746. Respective control input nodes of the multiplexers 744 and 746 are electrically connected to the output node of the sign bit determination circuit 731, and receive the sign bit output by the sign bit determination circuit 731.

A first input node of the multiplexer 744 is coupled to a storage element of the parameter buffer 218 that stores the parameter $\alpha_1+\delta\alpha_1$, and a second input node of the multiplexer 744 is coupled to a storage element of the parameter buffer 218 that stores the parameter $\alpha_2+\delta\alpha_2$. The storage element is a memory element, such as static random access memory (SRAM), of the parameter buffer 218. An output node of the multiplexer 744 is the output node of the first selection circuit 734 and is coupled to the respective input node of the multiplier 752.

The multiplexer 744 outputs the signal on the first input node of the multiplexer 744 (e.g., the first alpha/time constant parameter $\alpha_1+\delta\alpha_1$) when the signal on the control input node of the multiplexer 744 is "0" (e.g., when the sign bit is "0") and is configured to output the signal on the second input node of the multiplexer 744 (e.g., the second alpha/time constant parameter $\alpha_2+\delta\alpha_2$) when the signal on the control input node of the multiplexer 744 is "1" (e.g., when the sign bit is "1").

A first input node of the multiplexer 746 is coupled to a storage element of the parameter buffer 218 that stores the parameter "$1-(\alpha_1+\delta\alpha_1)$", and a second input node of the multiplexer 746 is coupled to a storage element of the parameter buffer 218 that stores the parameter "$1-(\alpha_2+\delta\alpha_2)$". An output node of the multiplexer 746 is the output node of the second selection circuit 736 and is electrically connected to the respective input node of the multiplier 756. The multiplexer 746 outputs the signal on the first input node of the multiplexer 746 (e.g., the first beta/time constant parameter $1-(\alpha_1+\theta\alpha_1)$) when the signal on the control input node of the multiplexer 746 is "0" (e.g., when the sign bit is "0") and outputs the signal on the second input node of the multiplexer 746 (e.g., the second beta/time constant parameter $1-(\alpha_2+\delta\alpha_2)$) when the signal on the control input node of the multiplexer 746 is "1" (e.g., when the sign bit is "1").

The sign bit determination circuit 731 is configured to identify and output the sign bit of the difference signal $r(n)-z^{-1}*r_{IIR}(n)$ to the first selection circuit 734 and the second selection circuit 736. The sign bit determination circuit 731 can be any connection and/or logic (e.g., a comparator) that propagates the sign bit of the difference signal $r(n)-z^{-1}*r_{IIR}(n)$ (e.g., based on the output of the subtractor 727). Hence, when the magnitude signal r(n) is greater than the digital response signal $z^{-1}*r_{IIR}(n)$, the sign bit of the difference signal $r(n)-z^{-1}*r_{IIR}(n)$ is "0", which is output to the first selection circuit 734 and the second selection circuit 736. When the digital response signal $z^{-1}*r_{IIR}(n)$ is greater than the magnitude signal r(n), the sign bit of the difference signal $r(n)-z^{-1}*r_{IIR}(n)$ is "1", which is output to the first selection circuit 734 and the second selection circuit 736.

The first selection circuit 734 is configured to selectively output a first parameter $\alpha_1+\delta\alpha_1$ or a second parameter $\alpha_2+\delta\alpha_2$ based on whether the sign bit output by the sign bit determination circuit 731 is "0" or "1". Similarly, the second selection circuit 736 is configured to selectively output a third parameter $1-(\alpha_1+\delta\alpha_1)$ or a fourth parameter $1-(\alpha_2+\delta\alpha_2)$ based on whether the sign bit output by the sign bit determination circuit 731 is "0" or "1". When the sign bit is "0", the first selection circuit 714 and the second selection circuit 715 output the parameters $(\alpha_1+\delta\alpha_1)$, $1-(\alpha_1+\delta\alpha_1)$, respectively. When the sign bit is "1", the first selection circuit 734 and the second selection circuit 736 output the second parameters $(\alpha_2+\delta\alpha_2)$, $1-(\alpha_2+\delta\alpha_2)$, respectively. Other configurations can be implemented, such as by switching when parameters are selectively output.

In one example, the operations of the IIR filter 720a and the IIR filter 720b are executed by common IIR filter circuitry. In another example, a first IIR filter circuit executes the IIR filter 720a and the second IIR filter circuit executes the IIR filter 720b.

As indicated, the sign bit is "0" when the magnitude signal r(n) is greater than the digital response signal $z^{-1}*r_{IIR}(n)$, which further indicates that the PA 206 will be in a charging mode with respect to the gate-lag model and the drain-lag model. Hence, the first alpha parameter $\alpha_1$ and/or the first alpha/time constant parameter $\delta\alpha_1$ that is output when the sign bit is "0" corresponds to the time constant of the charging mode (e.g., $\tau=\tau_{CHA}=R_{CHA}*C$, with values of $R_{CHA}$ and C depending on whether the IIR filter is modeled for the gate-lag model or the drain-lag model). As indicated, the sign bit is "1" when the digital response signal $z^{-1}*r_{IIR}(n)$ is greater than the magnitude signal r(n), which further indicates that the PA 206 will be in an emission mode with respect to the gate-lag model and the drain-lag model. Hence, the second alpha parameter $\alpha_2$ and/or the second alpha/time constant parameter $\delta\alpha_2$ that is output when the sign bit is "1" corresponds to the time constant of the emission mode (e.g., $\tau=\tau_{EMI}=(R_{CHA}\| R_{EMI})*C$ or $\tau=\tau_{EMI}=R_{EMI}*C$, depending on whether the IIR filter is modeled for the gate-lag model or the drain-lag model, respectively).

In one or more examples, selectively outputting the alpha parameters $\alpha_1$, $\alpha_2$, $\alpha_1+\delta\alpha_1$, and/or $(\alpha_2+\delta\alpha_2)$ implements the selected parameters in the transfer function of the corresponding IIR filter, which is configured to compensate for the different time constants of the charging mode and emission mode of the given model. Similarly, selectively outputting the parameters $1-\alpha_1$, $1-\alpha_2$, $1-(\alpha_1+\delta\alpha_1)$, and/or $1-(\alpha_2+\delta\alpha_2)$ implements the selected parameters in the transfer function of the corresponding IIR filter, which is configured to compensate for the different time constants of the charging mode and emission mode of the given model.

The signal output by the multiplexer 724 is received at a first input node of the multiplier 722. A second input node of the multiplier 722 receives the magnitude signal r(n) generated by the magnitude logic 504 from input digital signal x(n). The multiplier 722 multiplies the magnitude signal r(n) with the output of the multiplexer 724.

The signal output by the multiplexer 725 is received at an input node of the multiplier 726. A second input node of the multiplier 726 receives an output signal from an output node the delay unit 728. The multiplier 726 multiplies the output signal of the multiplexer 725 with the output signal (delayed digital response signal $r_{IIR}(n-1)$ or $z^{-1}*r_{IIR}(n)$ of the delay unit 728.

The adder 723 receives, at a first input node, the output signal of the multiplier 722, and, at a second input node, the output signal of the multiplier 726. The adder 723 adds the output signal of the multiplier 722 with the output signal of the multiplier 726 and generates the response signal $r_{IIR}(n)$.

An input node of the delay unit 728 is electrically connected to an output node of the adder 723 and receives the response signal $r_{IIR}(n)$. The delay unit 728 generates the delayed digital response signal $r_{IIR}(n-1)$ or $z^{-1}*r_{IIR}(n)$ from the response signal $r_{IIR}(n)$.

The adder 754 receives, at a first input node, the output signal of the multiplier 752, and, at a second input node, the output signal of the multiplier 756. The adder 754 adds the output signal of the multiplier 752 with the output signal of the multiplier 756 and generates a corresponding response signal.

An input node of the delay unit 758 is electrically connected to an output node of the adder 754 and receives the response signal from the adder 754. The delay unit 758 generates a corresponding delayed digital response signal.

The subtractor 770 receives an output of the adder 754 and an output of the adder 723 (e.g., $r_{IIR}(n)$). The subtractor 770 subtracts the output of the adder 723 from the output of the adder 754 to generate response signal $dr_{IIR}(n)$. Further, the response signal $dr_{IIR}(n)$ is multiplied with the signal $z_{IIR}(n)$ by multiplier 772 to generate the adjustment signal $u_\alpha(n)$.

The adaptation circuitry 216 generates updated parameters $\alpha_1'$ and $\alpha_2'$ from signal $u_\alpha$, the digital input signal x(n), the response signal y(n), and the output of the sign bit determination circuits 721 and/or 731. The adaptation circuitry 216 adjusts $\alpha_1$ and $\alpha_2$ such that difference (error) between response signal y(n) and digital input signal x(n) is mitigated.

Figure 8:
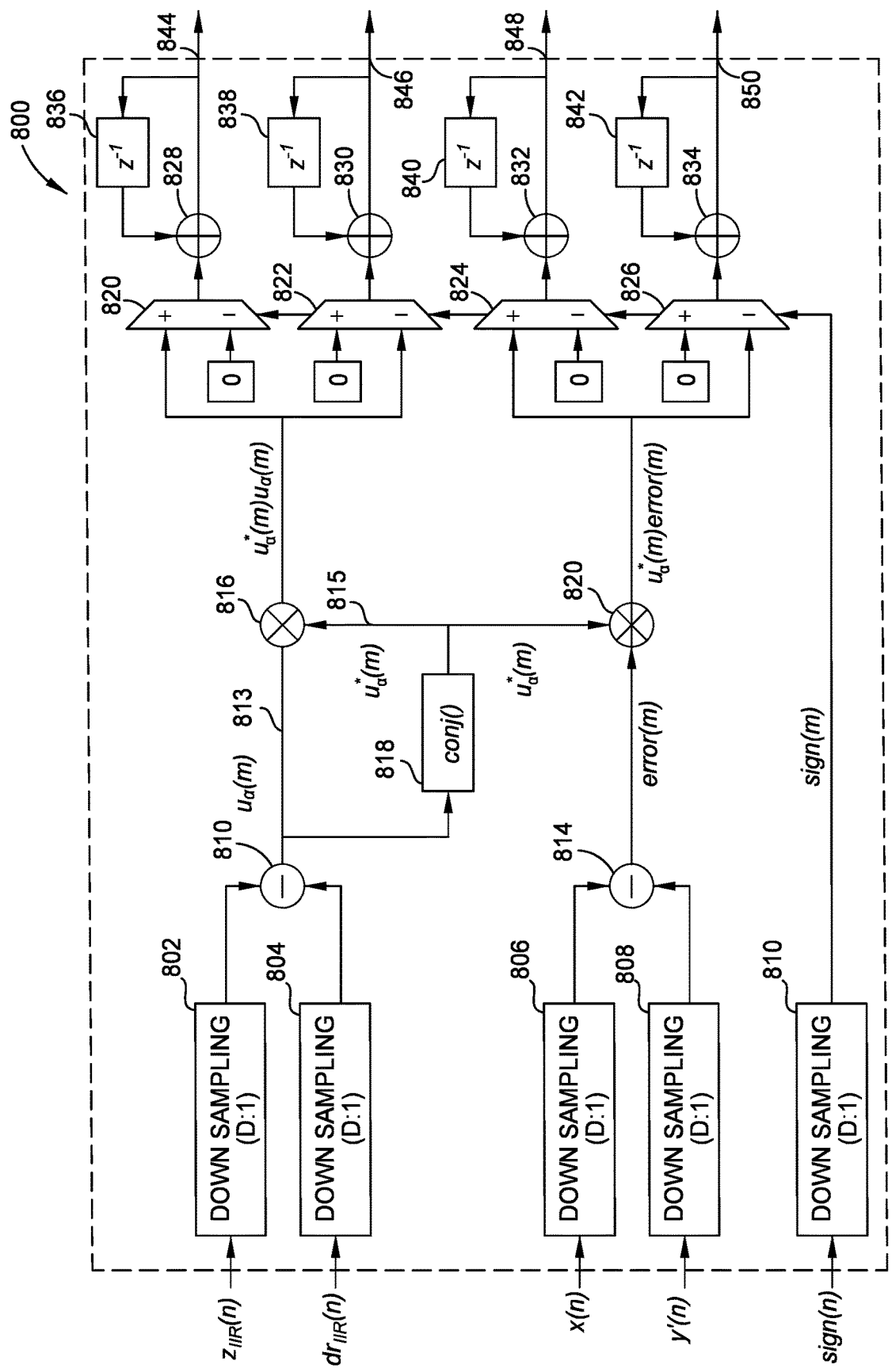
FIG. 8 is a schematic of an adjustment circuitry according to some examples.

FIG. 8 illustrates an example embodiment of the adaptation circuitry 216b, e.g., adaptation circuitry 800. The adaptation circuitry 800 may be implemented as the adaptation circuitry 216b of FIG. 7. The adaptation circuitry 800 includes down samplers 802, 804, 806, 808 and 810, multiplier 812, subtractor 814, conjugate circuit block 818, multipliers 816, 819, multiplexers 820, 822, 824, and 826, adders 828, 830, 832, and 834, and delay units 836, 838, 840, and 842. In one example, the multiplier 812 is the multiplier 772 of FIG. 7. In such an example, the multiplier 812 is external to the adaptation circuitry 800. Further, one or more of the down samplers 802, 804, 806, 808, and 810 may be internal to, and/or external to the adaption circuitry 800.

The down samplers 802, 804, 806, 808 and 810 down sample respective received signals by D to 1. D is an integer of greater than 1. In one example, D is 10, 100, 1000, or more. The amount that a down sampler down samples a corresponding input signal corresponds to an amount of noise (e.g., interference) of the corresponding DPD or PA. In one example, each down sampler 802, 804, 806, 808 and 810 down samples an input signal by a common amount. In another example, one or more of the down samplers 802, 804, 806, 808 and 810 down samples an input signal by an amount different than that of another one or more of the down samplers.

The input to the down sampler 802 receives the signal $z_{IIR}(n)$ from the node 709. With reference to FIG. 7 and FIG. 8, the input to the down sampler 802 is electrically connected to the node 709 and the down sampler 802 is positioned between the DPD sub-circuit 712 and the adaptation circuitry 216b. The down sampler 802 down samples the signal $z_{IIR}(n)$ to generate down sampled signal $z_{IIR}(m)$. The input to the down sampler 804 receives the signal $dr_{IIR}(n)$ from the output of the subtractor 770. The down sampler 804 is positioned between the subtractor 770 and the multiplier 772. The down sampler 804 down samples the signal $dr_{IIR}(n)$ to generate down sampled signal $dr_{IIR}(m)$.

The input to the down sampler 806 receives the input signal x(n) from the node 222. With reference to FIG. 7 and FIG. 8, the input to the down sampler 806 is electrically connected to the node 222 and is between the node 222 and the subtractor 814. The down sampler 806 down samples the input signal x(n) to generate down sampled input signal x(m).

The input to the down sampler 808 receives the response signal y'(n) from an output of the signal processing circuitry 550. With reference to FIG. 7 and FIG. 8, the down sampler 808 is disposed between the signal processing circuitry 550 and the subtractor 814. The input to the down sampler 808 is electrically connected to the output of the signal processing circuitry 550. The down sampler 808 down samples the response signal y'(n) to generate down sampled response signal y'(m).

The down sampler 810 receives the output of the sign bit determination circuit 721 or the sign bit determination circuit 731. For example, the down sampler 810 receives the signal sign(n) from one of the sign bit determination circuit 721 and sign bit determination circuit 731. The down sampler 810 down samples the signal sign(n) to generate down sampled signal sign(m). With reference to FIG. 7, the down sampler 810 is positioned between the sign bit determination circuit 721 or the sign bit determination circuit 731 and an input node of the adaptation circuitry 216b.

The output of the down sampler 810 is connected to a selection control input of the multiplexers 820, 822, 824, and 826. Accordingly, the down sampled sign signal sign(m) functions as the selection control signal for each of the multiplexers 820, 822, 824, and 826.

The outputs of the down samplers 802 and 804 are electrically connected to the input the multiplier 812. The multiplier 812 multiplies the down sampled signal $z_{IIR}(n)$ received from the down sampler 802 with the down sampled signal $dr_{IIR}(n)$ to generate adjustment signal $u_\alpha(m)$. The conjugate circuit block 818 receives the adjustment signal $u_\alpha(m)$ and generates the conjugate signal $u_\alpha(m)$ and outputs the conjugate signal $u_\alpha(m)$ on node 815. The multiplier 816 receives the adjustment signal $u_\alpha(m)$ from the node 813 and receives the conjugate signal $u_\alpha(m)$ from the node 815. The multiplier 816 multiplies the adjustment signal $u_\alpha(m)$ with the conjugate signal $u_\alpha(m)$ to generate the signal $u_\alpha^*(m)u_\alpha(m)$.

The output node of the multiplier 816 is electrically coupled to a first input of the multiplexer 820 and a second input of the multiplexer 822. The second input of the multiplexer 820 receives a signal having a zero value and the first input of the multiplexer 822 receives the signal having a zero value. The multiplexer 820 selects and outputs the signal $u_\alpha^*(m)u_\alpha(m)$ based on the signal sign(m) having a value of 0. Further, the multiplexer 822 selects and outputs the zero signal based on the signal sign(m) having a value of 0. Further, the multiplexer 822 selects and outputs the signal $u_\alpha^*(m)u_\alpha(m)$ based on the signal sign(m) having a value of 1. The multiplexer 820 selects and outputs the zero signal based on the signal sign(m) having a value of 1.

The adder 828 receives the output of the multiplexer 820 at a first input node. When the signal sign(m) has a value of 0, a second input node of the adder 828 is electrically coupled to an output node of the delay unit 836 and receives a delayed response signal $$\left(\sum_{m=1}^{M} u_\alpha^*(m)u_\alpha(m)\right)z^{-1} = \sum_{m=1}^{M-1} u_\alpha^*(m)u_\alpha(m).$$

The adder 828 generates summation signal $$\sum_{n=1}^{M} u_\alpha^*(m)u_\alpha(m)$$

by adding the delayed response signal $$\sum_{m=1}^{M-1} u_\alpha^*(m)u_\alpha(m)$$

with the signal $u_\alpha^*(m)u_\alpha(m)$. The summation signal $$\sum_{m=1}^{M} u_\alpha^*(m)u_\alpha(m)$$

is output on node 844. Further, when the signal sign(m) has a value of 0, the delay unit 836 outputs the delayed response signal $$\left(\sum_{m=1}^{M} u_\alpha^*(m)u_\alpha(m)\right)z^{-1}.$$

For example, the delay unit 836 delays the output of the adder 828 by one or more time periods. In one example, the delay unit 836 delays the output of the adder 828 by one time period $z^{-1}$.

When the signal sign(m) has a value of 1, the second input node of the adder 828 receives no signal or a signal having a zero value. Accordingly, the signal on the node 844 does not change value.

The adder 830 receives the output of the multiplexer 822 at a first input node. When the signal sign(m) has a value of 1, the output of the multiplexer 822 is signal $u_\alpha^*(m)u_\alpha(m)$. Further, a second input node of the adder 830 is electrically coupled to an output node of the delay unit 838 and receives a delayed response signal $$\left(\sum_{m=1}^{M} u_\alpha^*(m)u_\alpha(m)\right)z^{-1} = \sum_{m=1}^{M-1} u_\alpha^*(m)u_\alpha(m).$$

The adder 830 generates summation signal $$\sum_{n=1}^{M} u_\alpha^*(m)u_\alpha(m)$$

by adding the delayed response signal $$\sum_{m=1}^{M-1} u_\alpha^*(m)u_\alpha(m)$$

with the signal $u_\alpha^*(m)u_\alpha(m)$. The summation signal $$\sum_{m=1}^{M} u_\alpha^*(m)u_\alpha(m)$$

is the output node 846. Further, when the signal sign(m) has a value of 1, the delay unit 838 outputs the delayed response signal $$\left(\sum_{m=1}^{M} u_\alpha^*(m)u_\alpha(m)\right)z^{-1}.$$

For example, the delay unit 838 delays the output of the adder 830 by one or more time periods. In one example, the delay unit 838 delays the output of the adder 830 by one time period $z^{-1}$.

When the signal sign(m) has a value of 0, the second input node of the adder 830 receives no signal or a signal having a zero value. Accordingly, the signal on the node 846 does not change value.

The output on the node 844 is $B_1$, which is the summation $$\sum_{m=1}^{M} u_\alpha^*(m)u_\alpha(m)$$

with sign(m) having a value of 0. The output on the node 846 is $B_2$, which is the summation signal $$\sum_{m=1}^{M} u_\alpha^*(m)u_\alpha(m)$$

with sign(m) having a value of 1.

The subtractor 814 receives the down sampled digital input signal x(n) from the down sampler 806 and the down sampled response signal y'(n) from the down sampler 808 via first and second input nodes. The subtractor 814 subtracts the down sampled response signal y'(n) from the down sampled digital input signal x(n) to generate the error signal error(m). An input node of the multiplier 819 receives the error signal error(m) from an output node of the subtractor 814 and the conjugate signal $u_\alpha^*(m)$ from the node 815. The multiplier 819 multiplies the error signal error(m) with the conjugate signal $u_\alpha^*(m)$ to generate the signal $u_\alpha^*(m)$error(m). An output node of the multiplier 820 is electrically connected to a first input node of the multiplexer 824 and a second input node of the multiplexer 826. The second input of the multiplexer 824 is connected to the signal having a zero value, and the first input of the multiplexer 826 is connected to the signal having a zero value.

The multiplexer 824 selects and outputs the signal $u_\alpha^*(m)$error(m) and the multiplexer 826 selects and outputs a zero value based on the signal sign(m) having a value of 0. Further, the multiplexer 826 selects and outputs the signal $u_\alpha^*(m)$error(m) and the multiplexer 824 selects and outputs the zero value based on the signal sign(m) having a value of 1.

When the signal sign(m) has a value of 0, the multiplexer 824 outputs the signal $u_\alpha^*(m)$error(m). The adder 832 receives the output of the multiplexer 824 at a first input node. A second input node of the adder 832 is electrically coupled to an output node of the delay unit 840 and receives a delayed response signal $$\left(\sum_{m=1}^{M} u_\alpha^*(m)\text{error}(m)\right)z^{-1} = \sum_{m=1}^{M-1} u_\alpha^*(m)\text{error}(m).$$

The adder 832 generates summation signal $$\sum_{m=1}^{M} u_\alpha^*(m)\text{error}(m)$$

by the delayed response signal $$\sum_{m=1}^{M-1} u_\alpha^*(m)\text{error}(m)$$

with the signal $u_\alpha^*(m)$error(m). The summation signal $$\sum_{m=1}^{M} u_\alpha^*(m)\text{error}(m)$$

is output on node 848. Further, when the signal sign(m) has a value of 0, the delay unit 840 outputs the delayed response signal $$\left(\sum_{m=1}^{M} u_\alpha^*(m)\text{error}(m)\right)z^{-1}.$$

adder 832 by one or more time periods. In one example, the delay unit 840 delays the output of the adder 832 by one time period $z^{-1}$.

When the signal sign(m) has a value of 1, the second input node of the adder 832 receives a zero value as the input to the adder 832 is zero or has no value. Accordingly, the signal on the node 848 does not change value.

Further, when the signal sign(m) has a value of 1, the multiplexer 826 outputs the signal $u_\alpha^*(m)$error(m). The adder 834 receives the output of the multiplexer 826 at a first input node. A second input node of the adder 834 is electrically coupled to an output node of the delay unit 842 and receives a delayed response signal $$\left(\sum_{m=1}^{M} u_\alpha^*(m)\text{error}(m)\right)z^{-1} = \sum_{m=1}^{M-1} u_\alpha^*(m)\text{error}(m).$$

The adder 834 generates summation signal $$\sum_{m=1}^{M} u_\alpha^*(m)\text{error}(m)$$

by adding the delayed response signal $$\sum_{m=1}^{M-1} u_\alpha^*(m)\text{error}(m)$$

with the signal $u_\alpha^*(m)$error(m). The summation signal $$\sum_{m=1}^{M} u_\alpha^*(m)\text{error}(m)$$

is output on node 850. Further, when the signal sign(m) has a value of 1, the delay unit 842 outputs the delayed response signal $$\left(\sum_{m=0}^{M} u_\alpha^*(m)\text{error}(m)\right)z^{-1}.$$

For example, the delay unit 842 delays the output of the adder 834 by one or more time periods. In one example, the delay unit 842 delays the output of the adder 834 by one time period $z^{-1}$.

When the signal sign(m) has a value of 0, the multiplexer 826 outputs a signal having a zero value and the second input node of the adder 834 receives no signal or a signal having a zero value as the input to the adder 834 is zero or has no value. Accordingly, the signal on the node 850 does not change value.

The output on the node 848 is $A_1$, which is the summation $$\sum_{m=1}^{M} u_\alpha^*(m)\text{error}(m)$$

with sign(m) having a value of 0. The output on the node 850 is $A_2$, which is the summation $$\sum_{m=1}^{M} u_a^*(m)\text{error}(m)$$

with sign(m) having a value of 1.

The adaption circuitry 216b updates $\alpha_1$ based on:

$$\Delta\alpha_1 = (\delta\alpha_1)\frac{A_1}{B_1}.$$

The adaption circuitry 216b updates $\alpha_2$ based on:

$$\Delta\alpha_2 = (\delta\alpha_2)\frac{A_2}{B_2}.$$

In various examples, the DPD circuitry 202a and/or the DPD circuitry 202b may include more than two DPD paths. For example, the DPD circuitry 202a may include two or more DPD paths configured similar to that of DPD path 510. In such examples, the output of each of the DPD paths is multiplied to form the intermediate digital signal z(n). Further, the DPD circuitry 202b may include two or more DPD paths configured similar to that of DPD path 710. In such examples, the output of each of the DPD paths is combined to form the intermediate digital signal z(n).

Figure 9:
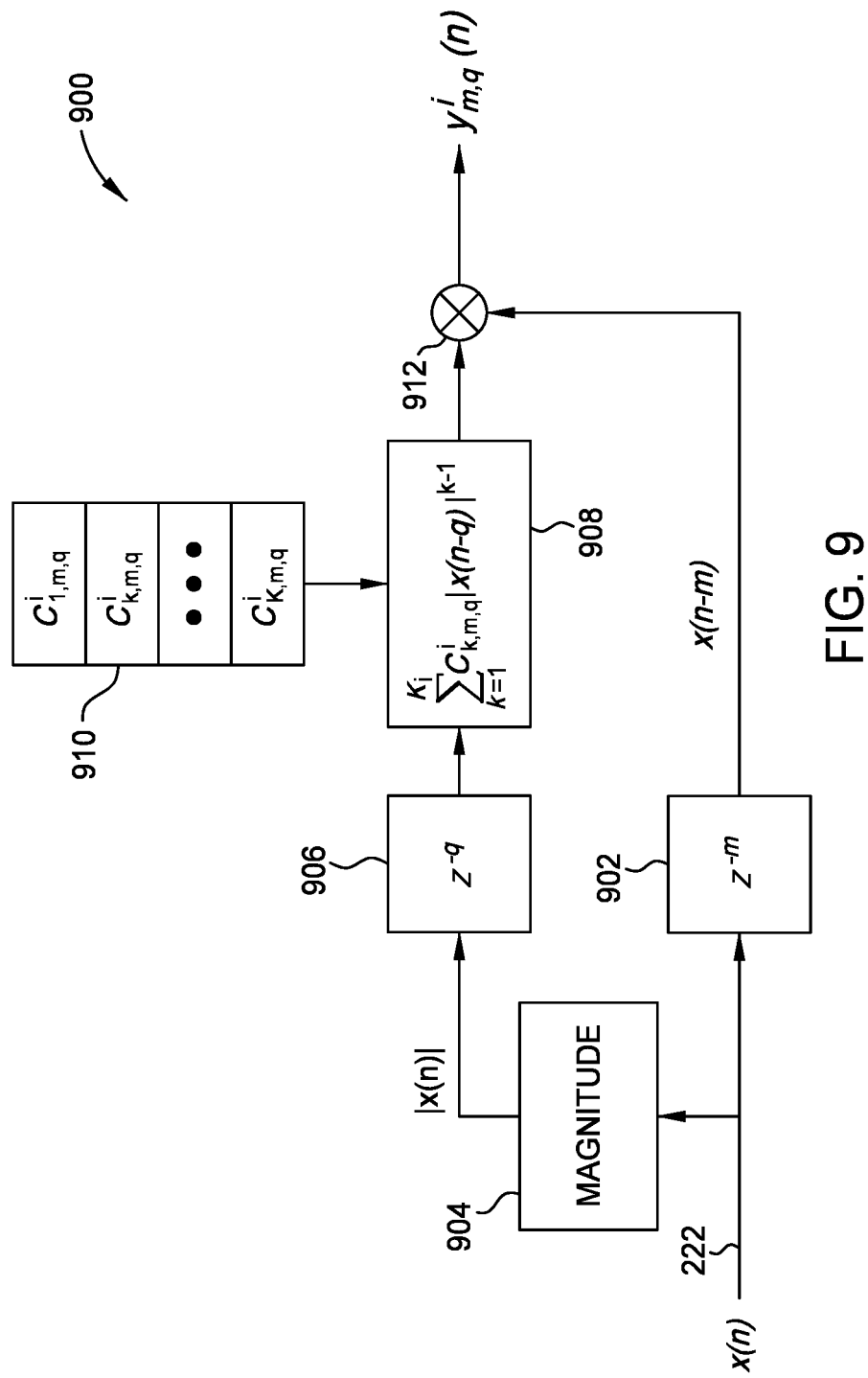
FIG. 9 is a schematic of a DPD sub-circuit according to some examples.

FIG. 9 illustrates a DPD sub-circuit 900 according to some examples. In various examples, the DPD sub-circuit 900 may be a memoryless DPD sub-circuit or a short term memory effect DPD sub-circuit. The DPD sub-circuit 900 can be implemented as the DPD sub-circuits 502, 512, and/or 712. In some examples, one or more DPD sub-circuits 502, 512, 712 in a DPD circuit may be a memoryless DPD path implemented based on a memoryless PA model (e.g., polynomial model or Saleh's model). In some examples, one or more DPD sub-circuits 502, 512, 712 in a DPD circuit may be a short term memory effect DPD path implemented based on a short term memory effect PA model, for example, a memory polynomial model or Volterra model. In some examples, the adaptation circuitry 216 updates the parameters of the DPD sub-circuits 502, 512, 712 based on signals x(n), z(n), and/or y'(n) received by the adaptation circuitry 216.

In some examples, the DPD sub-circuit 900 is a Volterra polynomial based non-linear function data path. A DPD sub-circuit 900 may be implemented with general memory polynomials having parameters $K_i$, $M_i$, and $Q_i$, where $K_i$ is referred to as the non-linear order of the DPD sub-circuit 900 (of index i), and $M_i$ and $Q_i$ are referred to as memory taps of the DPD sub-circuit 900 (of index i). The output distorted signal $y_{m,q}^i(n)$ of the DPD sub-circuit 900 (of index i) may be expressed, for each pair of m and q, as follows:

$$y_{m,q}^i(n) = x(n-m)\sum_{k=1}^{K_i} C_{k,m,q}^i |x(n-q)|^{k-1}$$

where k, m, and q are integers, and k=1:$K_i$, m=1:$M_i$, and q=1:$Q_i$.

The DPD sub-circuit 900 of FIG. 8 includes a delay unit 902, magnitude logic 904, a delay unit 906, series logic 908, a look-up table 910, and a multiplier 912. The input node 222 is coupled to respective input nodes of the delay unit 902 and the magnitude logic 904. An output node of the delay unit 902 is coupled to an input node of the multiplier 912. An output node of the magnitude logic 904 is coupled to an input node of the delay unit 906. An output node of the delay unit 906 is coupled to an input node of the series logic 908. The series logic 908 is coupled to the look-up table 910. An output node of the series logic 908 is coupled to another input node of the multiplier 912. An output node of the multiplier 912 is the output node of the DPD sub-circuit 900. The $DPD_{main}$ (502) and $DPD_{IIR}$ (512, or 712) consist of several parallel DPD sub-circuits 900. For example, $z_{main}(n)=\Sigma_{m,q}y_{m,q}^1(n)$ and $z_{IIR}(n)=\Sigma_{m,q}y_{m,q}^2(n)$.

In operation, the digital input signal x(n) is received by the DPD sub-circuit 900 at input node 222 and is input to the delay unit 902 and magnitude logic 904. The delay unit 902 is configured to delay the digital input signal x(n) by m time periods and output an m delayed digital signal x(n-m) to the multiplier 912. In some examples, m is a parameter generated by the adaptation circuitry 216 and stored, e.g., in the parameter buffer 218. The magnitude logic 904 is configured to receive the digital input signal x(n), generate a magnitude signal |x(n)| (e.g., r(n)) that is a magnitude of the digital input signal x(n), and output the magnitude signal |x(n)| to the delay unit 906. The delay unit 906 is configured to receive and delay the magnitude signal |x(n)| by q time periods and output a q delayed magnitude signal |x(n-q)| to series logic 908. In some examples, q is a parameter generated by the adaptation circuitry 216 and stored, e.g., in the parameter buffer 218. The series logic 908 is configured to receive the q delayed magnitude signal |x(n-q)|, access coefficients $C_{k,m,q}^i$ stored in the look-up table 910, perform mathematical operations to obtain a series signal $$\sum_{k=1}^{K_i} C_{k,m,q}^i |x(n-q)|^{k-1},$$

and output the series signal to the multiplier 912. In some examples, coefficients $C_{k,m,q}^i$ are parameters generated by the adaptation circuitry 216 and stored, e.g., in the parameter buffer 218, which forms at least part of the look-up table 910. The multiplier 912 is configured to receive the m delayed digital signal x(n-m) and the series signal, multiply the signals, and output the output distorted signal $y_{m,q}^i(n)$ to the output node.

The DPD sub-circuit 900 can implement different or the same coefficients and/or parameters in different instances of the DPD sub-circuit 502, 512, and/or 712. In some examples, each of the different the DPD sub-circuits are based on different models and have different coefficients and parameters. Any appropriate parameters and coefficients can be implemented based on the model.

The adaptation circuitry 216 can be configured to generate the parameters and coefficients of the DPD circuitry 202, such as coefficients and parameters of DPD sub-circuits 502, 512, 712 alpha parameters of one or more IIR filters 520, 720, and any other function circuit. The adaptation circuitry 216 can implement a least squares error (LSE) algorithm to determine the coefficients and parameters. The adaptation circuitry 216 can implement an iterative process, where the parameters and coefficients are initialized to some initial amount that determines coefficients and parameters for iteratively higher orders for models. The adaptation circuitry 216 can identify instances in errors between, e.g., the aligned digital output signal y'(n) and one or both of the digital input signal x(n) and digital intermediate signal z(n)

(e.g., whether the error is positive or negative), to determine a charging or emission mode of the PA 206 and corresponding time constant(s) and alpha parameter(s) for one or more IIR filters 520, 720.

The following describes a least squares adaptation to determine the coefficients by the adaptation circuitry 216. The digital output signal y(n) (which may also be the aligned digital output signal y'(n)) can be modeled as follows:

$$y(n) = \sum_{k=1,m=0}^{K,M} C_m^k x(n-m)|x(n-m)|^{k-1}$$

The adaptation circuitry 216 captures N samples of the digital input signal x(n) and the digital output signal y(n) (e.g., x(N), ..., x(1), and y(N), ..., y(1)). The above series to model y(n) can be indicated by a matric multiplication as below:

$$Y = U_x C$$

where:

$$Y = \begin{bmatrix} y(N) \\ \vdots \\ y(1) \end{bmatrix}$$

$$U_x = \begin{bmatrix} x(N) & x(N-1) & \ldots & x(N)|x(N)| & x(N-1)|x(N-1)| & \ldots & x(N-M)|x(N-M)|^{k-1} \\ & & & \ldots & & & \\ x(1) & x(0) & \ldots & x(1)|x(1)| & x(0)|x(0)| & \ldots & x(1-M)|x(1-M)|^{k-1} \end{bmatrix}$$

$$C = \begin{bmatrix} C_0^1 \\ C_1^1 \\ \vdots \\ C_0^2 \\ C_1^2 \\ \vdots \\ C_M^K \end{bmatrix}$$

The coefficients of matrix C can then be determined by multiplying the matrix inverse of the product of the complex conjugate of matrix $U_x$ and the matrix $U_x$ with the product of the complex conjugate of matrix $U_x$ and the matrix Y, as indicated below:

$$C = (U_x^H U_x)^{-1}(U_x^H Y)$$

Various circuits and logic described above can be implemented in any circuit or system. For example, the DPD circuitry 202, DAC 204, PA 206, ADC 210, alignment circuitry 214, adaptation circuitry 216, and/or parameter buffer 218 can be implemented as hardwired circuits and logic in an application specific integrated circuit (ASIC); as a system-on-chip (SoC) that includes, for example, hardwired circuit and logic and/or programmable processors or logic; and/or as a programmable logic device such as a field programmable gate array (FPGA). In some examples, the DPD circuitry 202, alignment circuitry 214, adaptation circuitry 216, and parameter buffer 218 can be implemented, at least in part, in programmable fabric of an FPGA (e.g., a RF System-on-Chip (SoC) FPGA).

Figure 10:
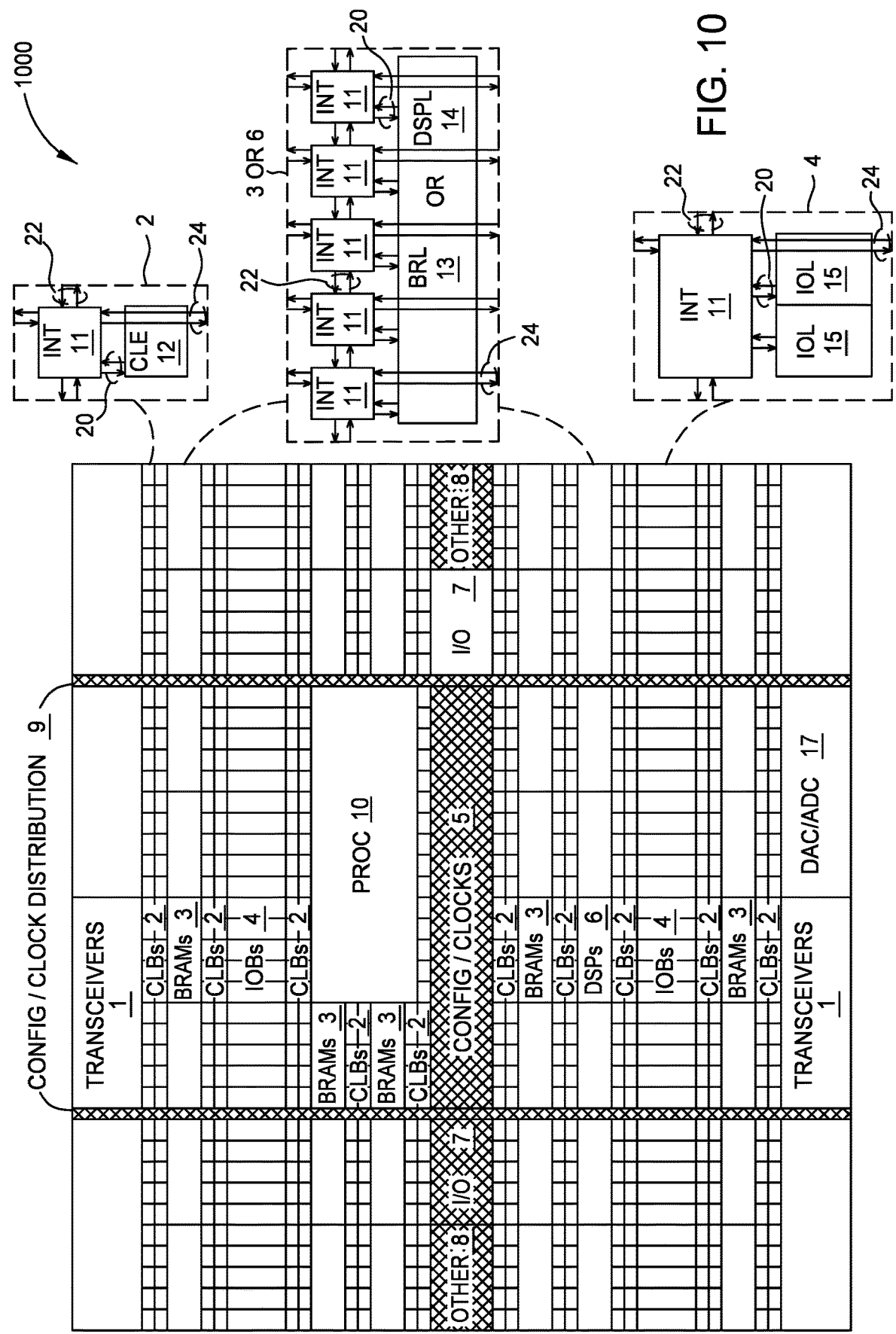
FIG. 10 is a schematic of an architecture of a field programmable gate array (FPGA) according to some examples.

FIG. 10 illustrates an architecture of FPGA 1000 that includes a large number of different programmable tiles including transceivers 1, configurable logic blocks (CLBs) 2, random access memory blocks (BRAMs) 3, input/output blocks (IOBs) 4, configuration and clocking logic (CONFIG/CLOCKS) 5, digital signal processing blocks (DSPs) 6, specialized input/output blocks (I/O) 7 (e.g., configuration ports and clock ports), and other programmable logic 8 such as digital clock managers, system monitoring logic, and so forth. Some FPGAs also include dedicated processor blocks (PROC) 10. The FPGA can also include a DAC/ADC circuitry 17 (e.g., RF-class DAC and RF-class ADC), and the like.

In some FPGAs, each programmable tile can include at least one programmable interconnect element (INT) 11 having connections to input and output terminals 20 of a programmable logic element within the same tile, as shown by examples included in FIG. 10. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element (CLE) 12 that can be programmed to implement user logic plus a single programmable interconnect element (INT) 11. A BRAM 3 can include a BRAM logic element (BRL) 13 in addition to one or more programmable interconnect elements. Typically, the number of interconnect elements included in a tile depends on the height of the tile. In the illustrated example, a BRAM tile has the same height as five CLBs, but other numbers (e.g., four) can also be used. A DSP 6 can include a DSP logic element (DSPL) 14 in addition to an appropriate number of programmable interconnect elements. An 10B 4 can include, for example, two instances of an input/output logic element (IOL) 15 in addition to one instance of the programmable interconnect element 11. As will be clear to those of skill in the art, the actual I/O pads connected, for example, to the input/output logic element 15 typically are not confined to the area of the input/output logic element 15.

In the pictured example, a horizontal area near the center of the die is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 10 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 10 is intended to illustrate only an example FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 10 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 11:
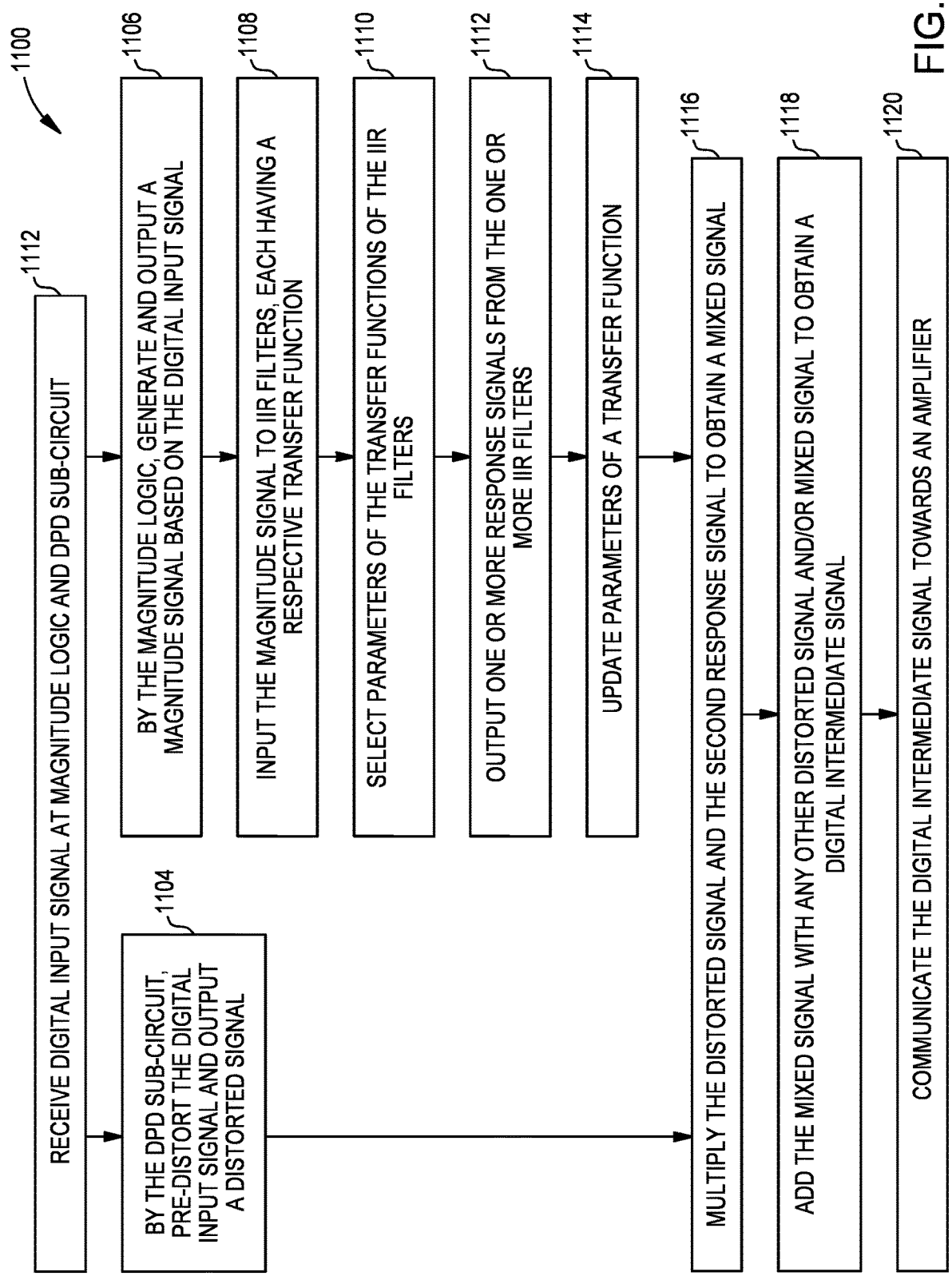
FIG. 11 is a method to process a signal to be transmitted by adding digital pre-distortion to the signal according to some examples.

FIG. 11 is a method 1100 to process a signal to be transmitted by adding digital pre-distortion to the signal according to some examples. At block 1102, a digital input signal is received at magnitude logic (e.g., magnitude logic 504) and a DPD sub-circuit (e.g., DPD sub-circuit 512, 712). At block 1104, the digital input signal is pre-distorted by the DPD sub-circuit, and a distorted signal is output from the DPD sub-circuit. The distorted signal can be generated as described above. At block 1106, the magnitude logic generates and outputs a magnitude signal based on the digital input signal. At block 1108, the magnitude signal is input to two or more IIR filters (e.g., IIR filters 520, 720), each of the IIR filters having a respective transfer function. At block 1110, parameters of the transfer functions (e.g., one or more alpha parameters) are selected based on the magnitude signal and one or more response signals passed from one or more of the transfer functions. For example, as described above with respect to FIG. 7, alpha parameters are selected based on a sign bit of a difference signal that is a difference between the magnitude signal |x(n)| (or r(n)) and the response signal $r_{IIR}(n)$. In various examples, the block 1110 is optional and is omitted. For example, with reference to FIG. 5, the block 1110 is omitted.

At block 1112, one or more response signals are output from the one or more IIR filters. At block 1114, parameters of the one or more transfer functions are updated. For example, as described above, alpha parameters are updated by the adaptation circuitry 216 based on an adjustment signal. Further, a first transfer function is based on a first parameter and a second transfer function is based on the first parameter and a time constant. Accordingly, the first and second transfer functions are different from each other.

At block 1116, the distorted signal (output by the DPD sub-circuit 512, 712) and the response output from the one or more IIR filters 520, 720 are multiplied to obtain a product signal. At block 1118, the product signal is added with any other distorted and/or product signal (e.g., from any other path) to obtain a digital intermediate signal (e.g., digital intermediate signal z(n)). At block 1122, the digital intermediate signal is communicated towards an amplifier (e.g., from the DPD circuitry 202a, 202b to the PA 206).

While the foregoing is directed to specific examples, other and further examples may be devised without departing from the basic scope thereof, and the scope thereof is determined by the claims that follow.

What is claimed is:

1. A transmitter for a communication system comprising:
 a digital pre-distortion (DPD) circuitry configured to generate a digital intermediate signal by compensating an input signal for distortions resulting from an amplifier, wherein the amplifier is configured to output an output signal based on the digital intermediate signal, the DPD circuitry includes one or more an infinite impulse response (IIR) filters configured to implement a first transfer function based on a first parameter, and a second transfer function based on the first parameter and a time constant, and wherein the DPD circuitry is configured to generate an adjustment signal based on the first transfer function and the second transfer function; and
 adaptation circuitry configured to:
  receive the adjustment signal from the DPD circuitry, the input signal from an input node and external to the DPD circuitry, and an output response signal, the output response signal based on the output signal; and
  update the first parameter based on the adjustment signal, the input signal, and the output response signal.

2. The transmitter of claim 1, wherein the one or more IIR filters is configured to:
 implement the first transfer function to generate a first filter response signal and implement the second transfer function to generate a second filter response signal; and
 generate a third filter response signal based on the first filter response signal and the second filter response signal.

3. The transmitter of claim 2, wherein the DPD circuitry further includes a DPD sub-circuit configured to generate a pre-distorted signal from the input signal, and wherein the adjustment signal is generated by multiplying the third filter response signal with the pre-distorted signal.

4. The transmitter of claim 3, wherein the adaptation circuitry is further configured to
 determine a first error output based on the adjustment signal;
 determine a second error output based on a difference between the input signal and the output response signal; and
 determine a change of the first parameter based on the first error output, the second error output, and the time constant.

5. The transmitter of claim 4, wherein the adaptation circuitry is further configured to:
 down sample the third filter response signal, the pre-distorted signal, the input signal, and the output response signal to generate a down sampled third response signal, a down sampled pre-distorted signal, a down sampled input signal, and a down sampled output response signal,
 wherein the adjustment signal is generated based on the down sampled third response signal and the down sampled pre-distorted signal, and wherein the second error output is determined based on a difference between the down sampled input signal and the down sampled output response signal.

6. The transmitter of claim 1, wherein an IIR filter circuit is configured to implement a first IIR filter of the one or more IIR filters and the first transfer function based on the first parameter, and a second IIR filter of the one or more IIR filters and the second transfer function based on the first parameter and the time constant.

7. The transmitter of claim 1, wherein the time constant corresponds to circuit elements of the DPD circuit.

8. The transmitter of claim 1, wherein the adaptation circuitry is further configured to update a second parameter, and wherein the IIR filter is configured to update the first transfer function and the second transfer function by selecting one of the updated first parameter and the updated second parameter.

9. The transmitter of claim 1, wherein the adaptation circuitry is further configured to configure the one or more IIR filters based on the updated first parameter.

10. A method of processing for transmission, the method comprising:
   performing digital pre-distortion on an input signal to generate a digital intermediate signal, performing the digital pre-distortion comprising:
      outputting a first filter response signal from one or more infinite impulse response (IIR) filters, the first filter response signal being based on the input signal and a first transfer function, the first transfer function based on a first parameter;
      outputting a second filter response signal from the one or more IIR filters, the second filter response signal being based on the input signal and a second transfer function, the second transfer function based on the first parameter and a time constant;
      generating an adjustment signal based on the first transfer function and the second transfer function; and
      updating, via adaptation circuitry, the first parameter based on the adjustment signal, the input signal, and an output response signal, wherein the output response signal is based on an output signal, the output signal is output by an amplifier based on the digital intermediate signal, and wherein the adaption circuitry is configured to receive the input signal from an input node and external to the one or more IIR filters.

11. The method of claim 10 further comprising generating a third filter response signal based on the first filter response signal and the second filter response signal.

12. The method of claim 11 further comprising generating a pre-distorted signal from the input signal, and wherein the adjustment signal is generated by multiplying the third filter response signal with the pre-distorted signal.

13. The method of claim 12 further comprising:
   determining a first error output based on the adjustment signal;
   determining a second error output based on a difference between the input signal and the output response signal; and
   determining a change of a value of the first parameter based on the first error output, the second error output, and the time constant.

14. The method of claim 13 further comprising:
   down sampling the third filter response signal, the pre-distorted signal, the input signal, and the output response signal to generate a down sampled third filter response signal, a down sampled pre-distorted signal, a down sampled input signal, and a down sampled output response signal,
   wherein the adjustment signal is generated based on the down sampled third filter response signal and the down sampled pre-distorted signal, and
   wherein the second error output is determined based on a difference between the down sampled input signal and the down sampled output response signal.

15. A communication system comprising:
   a transmitter configured to receive an input signal to be transmitted via an antenna, the transmitter comprising a power amplification circuitry, the power amplification circuitry comprising:
      a digital pre-distortion (DPD) circuitry configured to generate a digital intermediate signal based on the input signal, the DPD circuit circuitry including:
         one or more an infinite impulse response (IIR) filters configured to implement a first transfer function based on a first parameter, and a second transfer function based on the first parameter and a time constant, wherein the DPD circuitry is further configured to generate an adjustment signal based on the first transfer function and the second transfer function;
      an amplifier configured to generate an output signal based on the digital intermediate signal; and
      adaptation circuitry configured to:
         receive the adjustment signal from the DPD circuitry, the input signal from an input node and external to the DPD circuitry, and an output response signal, the output response signal based on the output signal; and
         update the first parameter based on the adjustment signal, the input signal, and the output response signal.

16. The communication system of claim 15, wherein the one or more IIR filters is configured to:
   implement the first transfer function to generate a first filter response signal and implement the second transfer function to generate a second filter response signal; and
   generate a third filter response signal based on the first filter response signal and the second filter response signal.

17. The communication system of claim 16, wherein the DPD circuitry further includes a DPD sub-circuit configured to generate a pre-distorted signal from the input signal, and wherein the adjustment signal is generated by multiplying the third filter response signal with the pre-distorted signal.

18. The communication system of claim 17, wherein the adaptation circuitry is further configured to
   determine a first error output based on the adjustment signal;
   determine a second error output based on a difference between the input signal and the output response signal; and
   determine a change of a value of the first parameter based on the first error output, the second error output, and the time constant.

19. The communication system of claim 18, wherein the adaptation circuitry is further configured to:
   down sample the third filter response signal, the pre-distorted signal, the input signal, and the output response signal to generate a down sampled third filter response signal, a down sampled pre-distorted signal, a down sampled input signal, and a down sampled output response signal,
   wherein the adjustment signal is generated based on the down sampled third filter response signal and the down sampled pre-distorted signal, and
   wherein the second error output is determined based on a difference between the down sampled input signal and the down sampled output response signal.

20. The communication system of claim 15, wherein an IIR filter circuit is configured to implement a first IIR filter of the one or more IIR filters and the first transfer function based on the first parameter, and a second IIR filter of the one or more IIR filters and the second transfer function based on the first parameter and the time constant.

* * * * *

UNITED STATES PATENT AND TRADEMARK OFFICE
CERTIFICATE OF CORRECTION

PATENT NO. : 11,563,453 B1
APPLICATION NO. : 17/239395
DATED : January 24, 2023
INVENTOR(S) : Hongzhi Zhao et al.

It is certified that error appears in the above-identified patent and that said Letters Patent is hereby corrected as shown below:

In the Specification

Column 6, Line 41, Delete "Oct" and insert -- $\delta\alpha$ --, therefor.

Column 10, approx. Line 12, Delete "$T_{EMI}$" and insert -- $\tau_{EMI}$ --, therefor.

Column 13, approx. Line 38, Delete "a" and insert -- $\alpha$ --, therefor.

Column 22, Line 65, Delete "uα(m)" and insert -- $u_\alpha^*(m)$ --, therefor.

Column 22, Line 66, Delete "uα(m)" and insert -- $u_\alpha^*(m)$ --, therefor.

Column 23, Line 01, Delete "uα(m)" and insert -- $u_\alpha^*(m)$ --, therefor.

Column 23, Line 03, Delete "uα(m)" and insert -- $u_\alpha^*(m)$ --, therefor.

Column 25, Line 43, After "by" insert -- adding --.

Column 25, Line 65, Before "adder" insert -- For example, the delay unit 840 delays the output of the --.

In the Claims

Column 34, Line 11, In Claim 15, after "DPD" delete "circuit".

Signed and Sealed this
Nineteenth Day of September, 2023

Katherine Kelly Vidal
*Director of the United States Patent and Trademark Office*